(12) United States Patent
Krause et al.

(10) Patent No.: US 11,881,537 B2
(45) Date of Patent: Jan. 23, 2024

(54) IMPACT IONIZATION LIGHT-EMITTING DIODES

(71) Applicant: Silanna UV Technologies Pte Ltd, Singapore (SG)

(72) Inventors: Norbert Krause, Hawthorne QLD (AU); Petar Atanackovic, Henley Beach South (AU)

(73) Assignee: Silanna UV Technologies Pte Ltd, Singapore (SG)

( * ) Notice: Subject to any disclaimer, the term of this patent is extended or adjusted under 35 U.S.C. 154(b) by 0 days.

(21) Appl. No.: 17/932,105

(22) Filed: Sep. 14, 2022

(65) Prior Publication Data

US 2023/0013843 A1   Jan. 19, 2023

Related U.S. Application Data

(63) Continuation of application No. 16/988,934, filed on Aug. 10, 2020, now Pat. No. 11,462,658.

(60) Provisional application No. 62/887,909, filed on Aug. 16, 2019.

(51) Int. Cl.
*H01L 33/00* (2010.01)
*H01L 33/14* (2010.01)
*H01L 33/04* (2010.01)
*H01L 33/26* (2010.01)
*H01L 33/32* (2010.01)

(52) U.S. Cl.
CPC ........ *H01L 33/0041* (2013.01); *H01L 33/002* (2013.01); *H01L 33/0025* (2013.01); *H01L 33/04* (2013.01); *H01L 33/14* (2013.01); *H01L 33/26* (2013.01); *H01L 33/32* (2013.01)

(58) Field of Classification Search
CPC .............. H01L 33/0041; H01L 33/002; H01L 33/0025; H01L 33/04; H01L 33/14; H01L 33/26; H01L 33/32
See application file for complete search history.

(56) References Cited

U.S. PATENT DOCUMENTS

| 9,412,911 | B2 | 8/2016 | Atanackovic |
| 9,685,587 | B2 | 6/2017 | Atanackovic |
| 9,691,938 | B2 | 6/2017 | Atanackovic et al. |
| 10,475,956 | B2 | 11/2019 | Atanackovic |
| 11,462,658 | B2 * | 10/2022 | Krause ............... H01L 33/0041 |
| 2017/0244002 | A1 * | 8/2017 | Campbell ......... H01L 31/03046 |
| 2021/0066545 | A1 * | 3/2021 | Bhusal .................... H01L 33/32 |

(Continued)

OTHER PUBLICATIONS

Bulutay, Electron initiated impact ionization in AlGaN alloys, Semiconductor Science and Technology, vol. 17, Aug. 2002, pp. L59-L62.

(Continued)

*Primary Examiner* — Mark W Tornow
(74) *Attorney, Agent, or Firm* — MLO, a professional corp.

(57) ABSTRACT

Embodiments disclose LEDs that operate using impact ionization. Devices include a first conductivity type layer having a first conductivity type, a first intrinsic layer, a charge layer, an impact ionization layer, and a contact layer. The charge layer has a net charge of the first conductivity type and has a material comprising a polar oxide or a non-polar oxide. The charge layer forms a barrier for transporting carriers of the first conductivity type until a bias is applied between the first conductivity type layer and the contact layer to flatten the barrier.

19 Claims, 16 Drawing Sheets

(56) References Cited

U.S. PATENT DOCUMENTS

2021/0343896 A1* 11/2021 Tang .................. H01L 33/0025
2022/0029007 A1* 1/2022 Chen .................. H01L 29/2003

OTHER PUBLICATIONS

Cao et al., Experimental characterization of impact ionization coefficients for electrons and holes in GaN grown on bulk GaN substrates, Applied Physics Letters, vol. 112, Jun. 2018, 6 pages.

Cho and Mishra, Epitaxial engineering of polar e-Ga2O3 for tunable two-dimensional electron gas at the heterointerface, Applied Physics Letters, vol. 112, Apr. 2018, 6 pages.

Ghosh and Singisetti, Impact ionization in b-Ga2O3, Journal of Applied Physics, vol. 124, Aug. 2018, 8 pages.

Hayashi et al., Polarity inversion of aluminum nitride by direct wafer bonding, Applied Physics Express, vol. 11, Feb. 2018, pp. 031003-1-031003-4.

Hiwang et al., ZnO-based light-emitting metal-insulator-semiconductor diodes, Applied Physics Letters, vol. 91, Sep. 2007, 4 pages.

Li et al., Calculation of the electron and hole impact ionization rate for wurtzite AlN and GaN, Semicond. Sci. Technology, vol. 25, Aug. 2010, 5 pages.

Mandal et al., Observation and discussion of avalanche electroluminescence in GaN p-n diodes offering a breakdown electric field of 3 MVcm-1, Semiconductor Science and Technology, vol. 33, May 2018, 6 pages.

Mengle et al., First-Principles Calculations of the Near-Edge Optical Properties of β-Ga2O3, Applied Physics Letters, vol. 109, Issue 21, Nov. 2016, 14 pages.

Miyake et al., Preparation o fhigh-quality AlN on sapphire by high-temperature face-to-face annealing, Journal of Crystal Growth, vol. 456, Aug. 2016, pp. 155-159.

Mousavi et al., Calculation of the Structural, Electrical, and Optical Properties of k-Al2O3 by Density Functional Theory, Chinese Journal of Physics, vol. 46, No. 2, Apr. 2018, pp. 170-180.

Notice of Allowance and Fees dated May 31, 2022 for U.S. Appl. No. 16/988,934.

Ozbek, Measurement of Impact Ionization Coefficients in GaN, A dissertation submitted to the Graduate Faculty of North Carolina State University, Dec. 2011, 91 pages, https://repository.lib.ncsu.edu/handle/1840.16/7459.

Wang et al., Band Gap and Band Offset of Ga 2 O 3 and ( AlxGa 1-x ) 2 O 3 Alloys, Physical Review Applied, vol. 10, Jul. 2018, 8 pages.

Zhang et al., Progress of ultra-wide band-gap Ga2O3 semiconductor materials in power MOSFETs, published in IEEE Transactions on Power Electronics, vol. 35, No. 5, May 2020, pp. 5157-5179, first published Oct. 2019.

Zheng et al., A PMT-like high gain avalanche photodiode based on GaN/AlN periodical stacked structure, Applied Physics Letters, vol. 109, Dec. 2016, 25 pages, https://aip.scitation.org/doi/10.1063/1.4972397.

* cited by examiner

IMPACT IONIZATION LIGHT-EMITTING DIODES

RELATED APPLICATIONS

This application is a continuation of U.S. patent application Ser. No. 16/988,934, filed on Aug. 10, 2020, and entitled "Impact Ionization Light-Emitting Diodes; which claims priority to U.S. Provisional Patent Application No. 62/887,909, filed on Aug. 16, 2019, and entitled "Impact Ionization Light-Emitting Diodes"; the contents of which are fully incorporated herein by reference.

BACKGROUND

Light-emitting diodes (LEDs) work by injecting electrons and holes ideally in equal quantities into a direct bandgap semiconductor where they are brought to overlap in a specific, confined region. In general, the electron injection is controlled by a metal contact to an n-doped section of the semiconductor, and the hole injection is controlled by a metal contact to a p-doped section of the semiconductor.

For short wavelengths (250 nm to 350 nm) aluminum nitride/gallium nitride (AlN/GaN) is the established material system. Major milestones in the industry were the realization of p-doping in GaN and the realization of polarization doping via a gradual or stepped change of composition. P-doping in AlN has been proven to be inefficient due to the very high activation energies required in AlN. The use of p-doped GaN to inject holes from a metal contact and the gradual step up of the hole in the graded polarization doping region allows large enough hole currents to generate light with commercially viable intensities down to approximately 250 nm wavelength.

For wavelengths shorter than 240 nm to 250 nm a number of problems emerge, resulting in a widely reported drop-off in radiative emission. Amongst others, the key problem is the direction of emission of UVC light from vertical (away from the device) to lateral in the plane of the device with increasingly shorter wavelengths. As there is no known effective p-doping of AlN, a p-GaN layer for the injection of holes is kept in UVC devices. This p-GaN layer, however, is highly absorbing and is detrimental to light emitted horizontally.

It is noteworthy that the absence of commercial emitters in this wavelength range below 250 nm allows for compromises in some of the other benchmark parameters of LEDs, such as operating bias, wall-plug efficiency (WPE), and lifetime.

SUMMARY

In some embodiments, a light-emitting diode device includes a first conductivity type layer; a first intrinsic layer on the first conductivity type layer; a charge layer on the first intrinsic layer; an impact ionization layer on the charge layer; and a contact layer on the impact ionization layer. The charge layer includes a first material and has a net charge of the first conductivity type. The impact ionization layer includes a second material. The charge layer forms a barrier for transporting carriers of the first conductivity type until a bias of at least 1.5 times a bandgap of the second material is applied between the first conductivity type layer and the contact layer, and a resulting electric field in the impact ionization layer is greater than or equal to an impact ionization threshold for the second material.

In some embodiments, a light-emitting diode device includes a first conductivity type layer; an impact ionization layer on the first conductivity type layer, a charge layer on the impact ionization layer; a first intrinsic layer on the charge layer; and a contact layer on the first intrinsic layer. The impact ionization layer includes a first material. The charge layer includes a second material and has a net charge of the first conductivity type. The charge layer forms a barrier for transporting carriers of the first conductivity type until a bias of at least 1.5 times a bandgap of the first material is applied between the first conductivity type layer and the contact layer, and a resulting electric field in the impact ionization layer is greater than or equal to an impact ionization threshold for the first material. The device comprises a metal polar growth.

In some embodiments, a light-emitting diode device includes a first conductivity type layer; a first intrinsic layer on the first conductivity type layer; a second intrinsic layer on the first intrinsic layer; a contact layer on the second intrinsic layer; and an interface between the first intrinsic layer and the second intrinsic layer. The first intrinsic layer comprises a first material having a first composition. The second intrinsic layer comprises a second material having a second composition that is heterogeneous from the first composition. Either the first intrinsic layer or the second intrinsic layer is an impact ionization layer. A compositional step between the first composition and the second composition at the interface creates a barrier for transporting carriers of the first conductivity type until a bias of at least 1.5 times a bandgap of the second material is applied between the first conductivity type layer and the contact layer, and a resulting electric field in the impact ionization layer is greater than or equal to an impact ionization threshold for the second material.

In some embodiments, a light-emitting diode device includes a first conductivity type layer; an impact ionization layer on the first conductivity type layer; an intrinsic layer on the impact ionization layer; a contact layer on the intrinsic layer; and an interface between the intrinsic layer and the impact ionization layer. The intrinsic layer comprises a first material having a first polarity. The impact ionization layer comprises a second material having a second polarity that is reversed from the first polarity. The reversal of the first polarity to the second polarity at the interface creates the barrier a barrier for transporting carriers of the first conductivity type until a bias of at least 1.5 times a bandgap of the second material is applied between the first conductivity type layer and the contact layer, and a resulting electric field in the impact ionization layer is greater than or equal to an impact ionization threshold for the second material.

In some embodiments, a light-emitting diode device includes a first conductivity type layer having a first conductivity type, a first intrinsic layer on the first conductivity type layer, a charge layer on the first intrinsic layer, an impact ionization layer on the charge layer, and a contact layer on the impact ionization layer. The charge layer includes a first material and has a net charge of the first conductivity type. The impact ionization layer includes a second material. The first material comprises a polar oxide or a non-polar oxide. The charge layer forms a barrier for transporting carriers of the first conductivity type until a bias is applied between the first conductivity type layer and the contact layer to flatten the barrier.

In some embodiments, a light-emitting diode device includes a first conductivity type layer having a first conductivity type, an impact ionization layer on the first conductivity type layer, a charge layer on the impact ionization layer, a first intrinsic layer on the charge layer, and a contact layer on the first intrinsic layer. The impact ionization layer includes a first material. The charge layer includes a second material and has a net charge of the first conductivity type. The second material comprises a polar oxide or a non-polar oxide. The charge layer forms a barrier for transporting carriers of the first conductivity type until a bias is applied between the first conductivity type layer and the contact layer to flatten the barrier.

DETAILED DESCRIPTION

Figure 1:
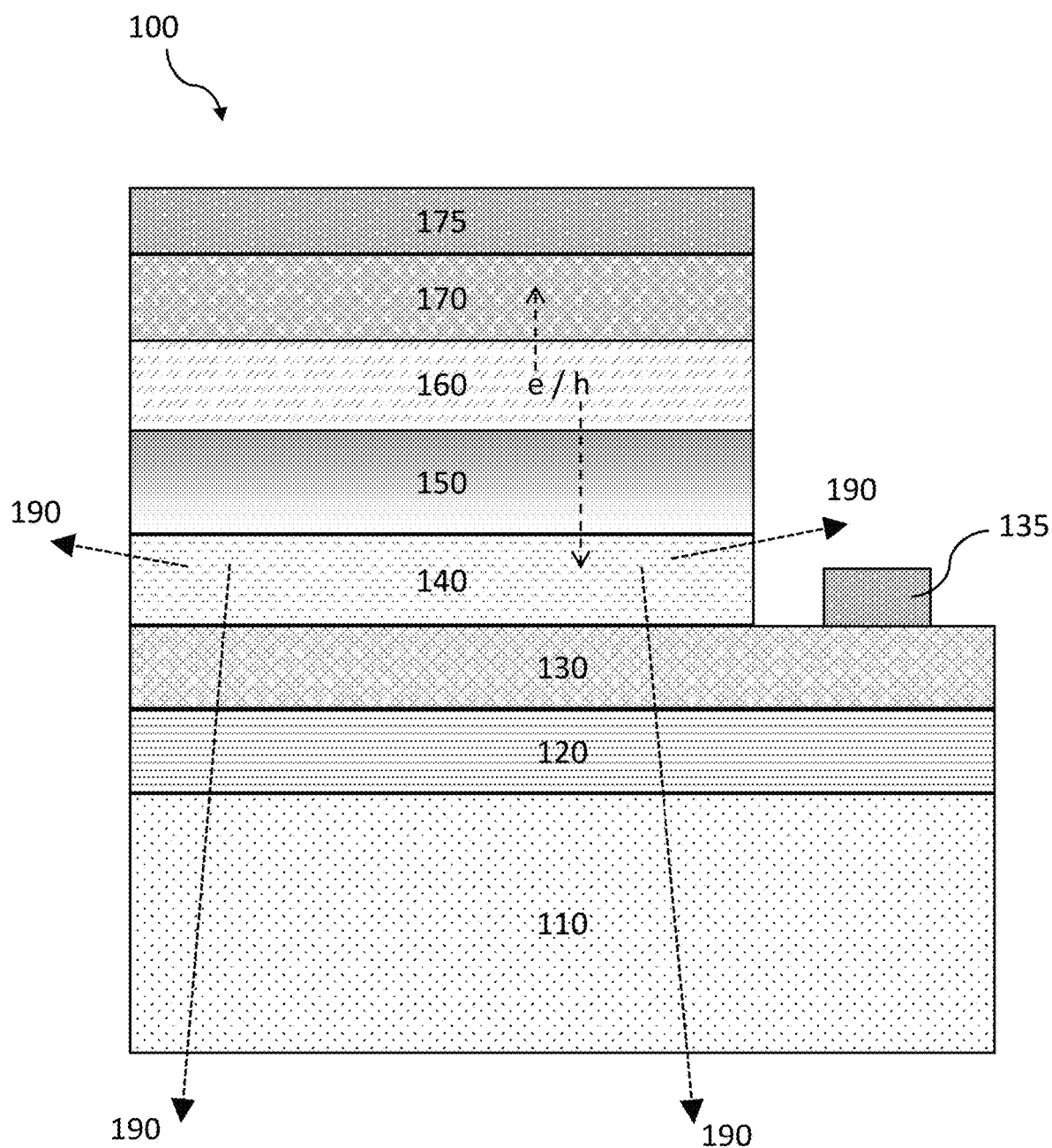
FIG. 1 is a cross-sectional view of an impact ionization LED device structure, in accordance with some embodiments.

The present embodiments describe a new approach to short wavelength LEDs such as in the ultraviolet-C ("UVC," 200 nm to 280 nm, also referred to as deep ultraviolet "DUV") wavelength range. For example, embodiments enable the effective generation of light in AlN/GaN material systems at wavelengths of 200-280 nm, such as 210-230 nm, or 230-250 nm, or 250-280 nm. In contrast to conventional p-i-n devices, embodiments of the present devices and methods use impact ionization in semiconductor materials to generate carrier species in an impact ionization layer. Devices of the present disclosure are uniquely structured to create a barrier in the conduction band that inhibits current flow until a bias is reached where the current starts to flow, at which point impact ionization can occur. The barrier will also be referred to as a "charge" layer "c" in some embodiments of the present disclosure. For an n-type device, holes are generated in the impact ionization layer "im" which is an intrinsic layer adjacent to the charge layer. Holes and electrons recombine in another intrinsic layer "i." Because holes are generated in the impact ionization layer, a separate p-type layer is advantageously not needed, resulting in device with an n-i-c-im-n (or n-i-c-im) structure. Although embodiments will primarily be described in terms of n-type devices, embodiments also include p-type devices having a p-i-c-im-p (or p-i-c-im) structure.

In some embodiments, the barrier is generated by a space charge originating from the charge layer. That is, the charge layer has a net charge which may be created by a gradient between materials in the charge layer. Some embodiments utilize polar semiconductor materials to create the gradient. For example, the net charge may occur due to a gradient between two polar materials such as AlN to GaN or an AlN/GaN superlattice chirp from AlN to GaN. In such embodiments the barrier is primarily a polarity barrier that may be created by a gradual chirp in composition. In other examples, the barrier may occur at an interface between two polar layers, such as AlN metal polar to AlN to nitrogen-polar.

The present embodiments also disclose implementation of impact ionization in oxide wide bandgap semiconductor systems, such as for polar oxides, without the presence of p-doping. Conventionally, hole doping in oxide wide bandgap materials is considered difficult and has not been demonstrated as there are no effective dopants. In some embodiments, the charge layer may comprise a combination of polar and non-polar materials.

In some embodiments, the barrier is a barrier in the band, such as by an inversion of charge between layers. The barrier in these embodiments is at the interface between two layers that have polarities reversed from each other, thus generating a polarization charge.

Embodiments also include impact ionization devices in which the barrier is generated through the formation of a heterogenous compositional step between materials. Embodiments include utilizing only non-polar oxides, without the presence of p-doping. In non-polar embodiments, a barrier to current flow may be created by a bandgap step between a first non-polar oxide in an intrinsic layer to a second non-polar oxide in an impact ionization layer, where the first and second non-polar oxides have different compositions. The barrier for current flow occurs at the interface between the two non-polar oxide materials.

In conventional LEDs, hole injection from a metal contact through a p-doped semiconductor layer is utilized to sustain the electron-hole recombination that generates light. Another method of producing electrons and holes in other types of conventional semiconductor devices is impact ionization, which is a process where an electron (or hole) is accelerated in the internal field of a device until it exceeds a critical energy. The accelerated electron or hole generates an extra electron/hole (e/h) pair when colliding with another electron, thereby exciting the impacted electron from the valence band to the conduction band. There are a range of known devices using impact ionization such as photo avalanche detectors. However, impact ionization devices have conventionally not been used for generating light because the high field required for the impact ionization process does not allow overlapping of electrons and holes effectively.

Some embodiments uniquely utilize the principle of impact ionization in LEDs through incorporation of an impact ionization layer and a "charge" layer that has a polarization charge, causing a kink in the band structure. The charge layer enables sufficient electric field to build up in the impact ionization layer for the impact ionization process to occur. Recombination of electrons and holes occurs in a first intrinsic layer that is on one side of the charge layer, where the impact ionization layer is a second intrinsic layer on the opposite side of the charge layer.

FIG. 1 is a cross-sectional view of an example LED device 100 that operates using impact ionization, in accordance with some embodiments. The layer thicknesses in FIG. 1 and other schematics in this disclosure are not to scale. The device 100 has a layer stack that includes a substrate 110, a buffer layer 120 on the substrate 110, a layer 130 of a first conductivity type on the buffer layer 120, a first intrinsic layer 140 on the first conductivity type layer 130, a charge layer 150 on the first intrinsic layer 140, an impact ionization layer 160 on the charge layer 150, and a contact layer 170 on the impact ionization layer 160. A first contact 135 is also on the first conductivity type layer 130, and a top contact 175 is on the contact layer 170. First contact 135 and top contact 175 are metal, such as titanium or aluminum, and enable connection of the device 100 to terminals of a voltage source. The device 100 shall be described as an n-type device (n-i-c-im-n, from substrate up), but also applies to a p-type structure (p-i-c-im-p). For embodiments in which the first conductivity type is n-type, the majority carriers transported are electrons. For embodiments in which the first conductivity type is p-type, the carriers are holes.

The material for substrate 110 is chosen to be suitable for the growth structure of the layers. In some embodiments, the device utilizes metal polar growth and the substrate 110 may be, for example, AlN or sapphire, such as c-sapphire. The buffer layer 120 provides a transition between the substrate 110 and the remaining semiconductor structure of device 100, such as to provide matching of the lattice structure of the substrate 110 to that of layer 130, and/or to act as a strain control mechanism.

The first conductivity type layer 130 serves as an n-region and as a lateral conductive layer for first contact 135, and typically includes a base and a cap layer (not shown). In some embodiments, the first contact 135 is formed by etching, and contact layer 170 is an unetched mesa on which the top contact 175 is formed. In some embodiments, both the first contact 135 and top contact 175 are in contact with n-doped layers (first conductivity type layer 130 and contact layer 170, respectively). In other embodiments, contact layer 170 may be intrinsic. Contact layer 170 is an electrical contact layer to maximize the electric field in impact ionization layer 160. Other methods of forming the contact junctions are within the scope of the present disclosure, including but not limited to vertical devices with laser lift-off or mesas with regrowth of an n-contact. Contacts can also be formed as disclosed in U.S. Pat. No. 9,412,911 titled "Optical Tuning of Light Emitting Semiconductor Junctions," issued Aug. 9, 2016, assigned to the Applicant of the present application and incorporated by reference herein in its entirety.

In some embodiments, contact layer 170 may be omitted, such that the device 100 is an n-i-c-im structure. The overshooting electrons will still enter the second metal electrode, and the bias required to operate the device will be higher than embodiments with the contact layer 170. In an example n-i-c-im structure, a light-emitting diode device may comprise an n-type layer; a first intrinsic layer on the n-type layer; a charge layer on the first intrinsic layer, the charge layer comprising a first material and having a net negative charge; and an impact ionization layer on the charge layer, the impact ionization layer comprising a second material. The charge layer forms a barrier for transporting electrons until a bias of at least 1.5 times higher than a bandgap of the second material is applied to the impact ionization layer, and a resulting electric field in the impact ionization layer is greater than or equal to an impact ionization threshold for the second material. In some embodiments, the first material of the charge layer may be a chirped composition that is chirped from a first composition near the first intrinsic layer to a second composition away from the first intrinsic layer. In some embodiments, the first material comprises AlN, and the second material is GaN. In some embodiments, the impact ionization layer is a second intrinsic layer.

In some embodiments, the overall structure can be a vertical device as in FIG. 1 that feeds in electrons from a bottom contact and extracts the electrons through a top contact. In some embodiments, the structure may feed in electrons from a top contact and extract the electrons through a bottom contact as shall be described in FIG. 3.

In FIG. 1, first intrinsic layer 140 is where recombination occurs. Charge layer 150 is made of a first material, and the charge layer 150 has a net charge of a first conductivity type. The first material of charge layer 150 has a gradual or abrupt change of the composition of two polar materials with non-equal polarization. For example, the first material of the charge layer may be a graded mix of two sub-materials to create the polarization. The charge layer primarily operates as a polarity barrier due to its net charge, but also contributes as a compositional barrier mechanism due to the step in band width created by the compositional change across the charge layer. Impact ionization layer 160 is made of a second material and is where impact ionization occurs under appropriate biasing conditions. In some embodiments, the second material (material of the impact ionization layer) is of the same polarization as the endpoint of the chirp in the first material (material of the charge layer). In some embodiments, if the first material of the charge layer has a first sub-material with P1 polarization and a second sub-material with P2 polarization, then the impact ionization layer favorably has a polarization P3 with $P1<P2 \leq P3$. In a specific example, the first material may be made of sub-materials AlN and GaN, where the first material has a chirp that increases in GaN percentage toward the impact ionization layer. In this case, the impact ionization layer is made of GaN. AlN has a spontaneous polarization Psp=−0.081 C/m2 and GaN has Psp=−0.029 C/m2, so the impact ionization layer must have a Psp$\geq$−0.029 C/m2.

In some embodiments, strain can be utilized to change the polarization of a layer (e.g., in nitride-based systems) and accordingly the charge layer can be controlled by managing strain. That is, the first material of the charge layer may comprise a strain profile that creates the net charge, where the strain profile is configured to tailor the polarization of the charge layer as described in, for example, U.S. Pat. No. 10,475,956 titled "Optoelectronic Device," issued Nov. 12, 2019, owned by the Applicant of the present disclosure and which is incorporated by reference herein in its entirety.

Device layers throughout this disclosure may be constructed using superlattice and short-period superlattices as disclosed in U.S. Pat. No. 10,475,956 as well as in U.S. Pat.

No. 9,685,587 titled "Electronic Devices Comprising N-type and P-type Superlattices," issued Jun. 20, 2017; and U.S. Pat. No. 9,691,938 titled "Advanced Electronic Device Structures Using Semiconductor Structures and Superlattices," issued Jun. 27, 2017; all of which are assigned to the Applicant of the present disclosure and are hereby incorporated by reference in their entirety.

The charge layer 150 forms a barrier for transporting carriers of the first conductivity type until a bias of at least 1.5 times a bandgap of the second material is applied between the first conductivity type layer and the contact layer, and a resulting electric field in the impact ionization layer is greater than or equal to an impact ionization threshold for the second material. To operate, the device needs to be at an operating current (e.g., 1-100 A/cm2) in addition to the required electric field and required device bias. Light 190 (indicated by dotted lines) that is emitted from the intrinsic layer 140 exits the LED device 100 vertically through the substrate 110 and also in the lateral direction.

The onset of electron current is designed so that electrons all enter a very high field region in impact ionization layer 160, the high field region being enabled by the charge layer 150. Some electrons undergo impact ionization in impact ionization layer 160. Once an electron/hole (e/h) pair is generated by a collision created by an electron accelerated by the high electric field, the pair is separated, and the hole "h" is available for recombination. The original electron "e" and the generated electron from the impact ionization continue to the anode (top contact 175). The generated hole drifts back to a low field region that forms in the first intrinsic layer 140 and recombines there with an electron. Thus, the recombination occurs in an intrinsic region. There is no p-doping required, such that the device may be, for example, n-i or n-i-n based. In other embodiments, hole injection may be used to generate e/h pairs via impact ionization. The electrons would then drift back into the low field region where they recombine with holes.

One of the reasons for the high emissivity in the present impact ionization LEDs is the recombination in an intrinsic low field region. This is made possible in the present devices because of a fixed charge deposit in the charge layer 150, which in effect dopes the device center in p, and the i-region (intrinsic layer 140) flattens out under bias. If the device were without the charge layer 150, the electric field would always be present in any intrinsic region. The fixed charge in charge layer 150 may be created by methods such as chirping, doping, or polarity inversion, as shall be described later in this disclosure.

Figure 2A:
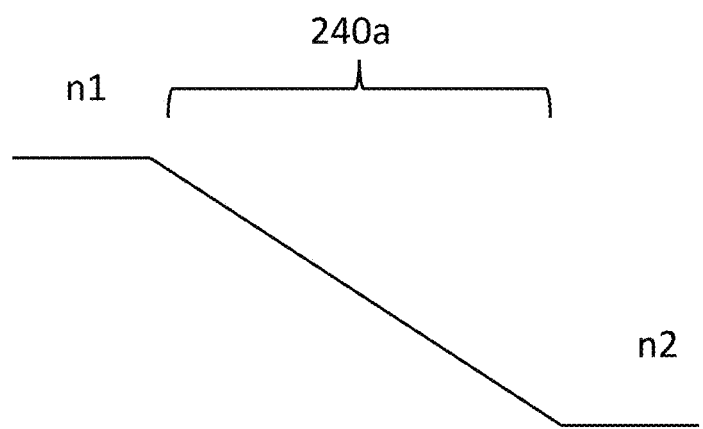
FIGS. 2A-2B are electron energy band diagrams illustrating space charge in devices without and with compositional grading, in accordance with some embodiments.
Figure 2B:
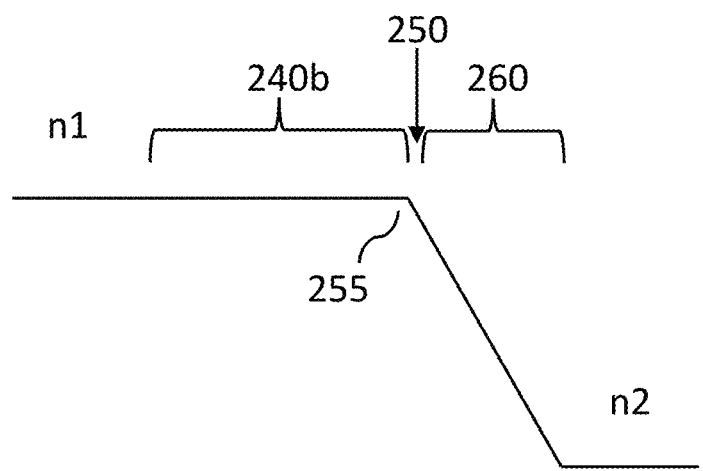

When the external bias applied to device 100 is such that the negative charge on the cathode (first contact 135) is equal to this deposited charge, then the energy band in the intrinsic region (first intrinsic layer 140) is flat. This concept is explained in terms of space charge by FIGS. 2A-2B, which are energy band diagrams of the conduction band. Region n1 is a first n-type layer, such as layer 130 of device 100, and region n2 is a second n-type layer such as contact layer 170. In FIG. 2A, the region between n1 and n2 is an intrinsic region 240a through the entire layer. The applied bias creates a slope in the conduction band in the entire region 240a between n1 and n2. In contrast, in FIG. 2B the region between n1 and n2 has an intrinsic region 240b along with an impact ionization layer 260. The charge layer 250 is at the interface between intrinsic region 240b and impact ionization layer 260. FIG. 2B illustrates the general effect of charge deposition in an n-i-n device (i.e., n1-i-c-im-n2), for example by compositional grading from AlN to GaN in the direction from n1 to n2. When under bias the band in the intrinsic region 240b has zero or at least a low electric field, the working point of the device is reached, and holes and electrons can recombine.

Applying the concept of recombination in the intrinsic region to short wavelengths, such as of approximately 200-280 nm or 210-230 nm, the principal mechanism of recombination can remain the same. In the embodiment of FIG. 1, the layers below first intrinsic layer 140 must be sufficiently transparent to the generated light so that the light can be emitted from the device. In order to maintain optical transparency, the n-composition must reflect the i-composition.

Multiple impact ionization is possible if the impact ionization layer is thick enough to allow the charges to gain enough momentum for another event. Likewise, the generated holes can effectively perform impact ionization. As understood in the art, the number of generated charges in an impact ionization process is highly dependent on the length of interaction, the bias, the charge species and the material, for example as described in Li et al. "Calculation of the electron and hole impact ionization rate for wurtzite AlN and GaN." Semiconductor Science and Technology, Vol. 25, 115010.

The present embodiments may involve multiple impact ionizations. In an ideal impact ionization in which the field is high enough to generate one pair of e/h, for every electron injected into the n contact, one electron exits from the other n contact, and one photon is emitted (or its equivalent in heat). For higher electric fields or thicker impact ionization layer this 1:1 ratio of overshooting current and photon generation can be further shifted as multiple impact ionizations can occur.

If the field region is wide (sufficiently thick) and the voltage drop across it is accordingly large, multiple impact ionizations may occur. This can be achieved by tailoring the impact ionization layer (which may be made of GaN in some embodiments) after the charge layer. The impact ionization layer determines the total voltage and number of impact ionizations per electron passing through.

Multiple impact ionization shall now be described for the case where only electrons contribute. In a single impact ionization, for each electron entering and leaving the device one recombination event electron/hole occurs. For double impact ionization, for each electron entering the device, two recombination events can occur. For n impact ionizations, n+1 electrons enter the device and n recombination events occur. The ratio of light emission to electron current can therefore be improved by increasing the width (thickness) of the impact ionization layer of a n1-i-c-im-n2 device. The width is determined by the overall required field (e.g., 200 MV/m to 500 MV/m) and the number of impact ionizations an electron must undergo, and the average voltage required (about 1.5 to 2× bandgap per event).

If in a wide field region, the impact region is of sufficiently high AlN concentration "x," the hole impact ionization rate is very low and only electron multiplication occurs. This requires a reduced chirp region as the composition from AlN to AlGaN reduces the degree of polarization charge and hence the barrier. Such a construction may open a path to a transparent impact ionization device where the top electrode made from Al would reflect the light up to much shorter wavelength.

Impact ionization is strongly field dependent, energy dependent, material dependent and charge species dependent. Impact ionization is possible whenever a critical energy is exceeded (about 1.5× bandgap), the critical energy being based on an impact ionization threshold for the material in which the impact ionization is taking place. The impact ionization requires the electron (or hole) to be able to gather enough energy in the high electric field to excite an electron/hole pair across the bandgap. For a charge to gather the required minimal energy, for example a minimum electric field of 100 MeV/m to 1000 MeV/m in accordance with some embodiments is required. The device also needs to be at the operating current at the required electric field and device bias.

It is important to realize that the impact ionization process is statistical and that some electrons thermalize before reaching critical energies, especially around the lower fields. Hence low hole generation efficiencies would be expected when—at a suitable electron current—the field is just slightly above minimum.

Figure 9:
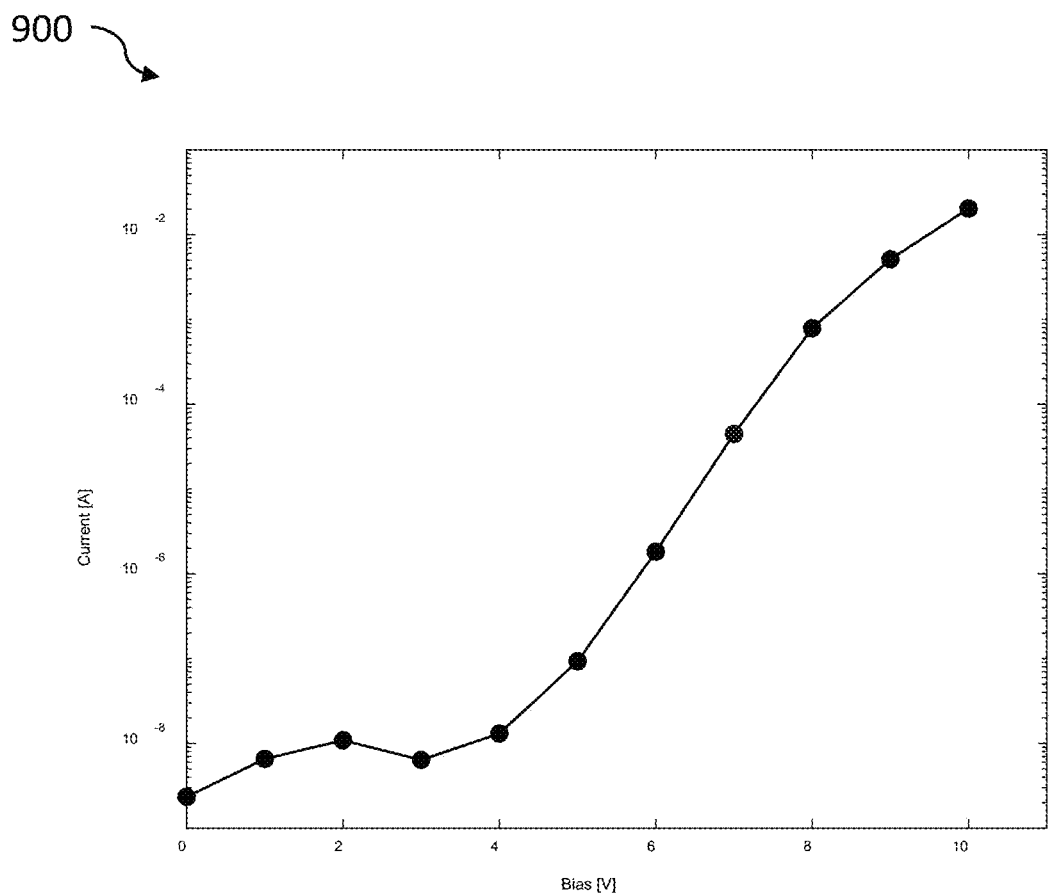
FIG. 9 is an IV-curve for an example impact ionization device, in accordance with some embodiments.

Embodiments of the present impact ionization devices uniquely utilize a design criterion of controlling both the electric field and the current injection. The minimum electric field required determines the minimum voltage required to operate the impact ionization device, alongside the minimum voltage that is required to create the required current across the LED. The bias required may be at least about 1.5 times higher than the bandgap of the material of the impact ionization layer. For example, the required bias applied to the device may be 5.1 V or higher (e.g., 6 V or higher, or 10 V or higher), such as for an impact ionization layer made of GaN. In practice, a bias larger than 6V to 8V may be required due to serial resistances of the contact layers. As an example. FIG. 9 shows current increasing from about 5V, but light emission setting in from 7.5V, indicating a 2.4V serial resistance being present.

A highly efficient impact ionization device is built in the present embodiments by creating an electric field that is large enough before a significant electron current is allowed to flow, which is achieved through the use of a barrier for electrons. This barrier is generated either by the space charge originating from the charge layer or through a barrier in the band, through the formation of a heterogenous compositional step. In embodiments using a space charge of a charge layer, the internal fixed charge of the charge layer is created by compositional structures, polarity inversion, or other methods such as doping that add a space charge. The charge layer forms a barrier to majority carrier transport per design until a bias high enough to cause current across the barrier is applied and the ensuing electric field in the intrinsic and charge layers is high enough for high impact ionization rates.

In some embodiments, the fixed charge deposit in the charge layer is achieved by a chirped region between the first intrinsic layer and the second intrinsic layer (impact ionization layer) such as an n1-i-c-im-n2 structure, where the chirp-induced charges allow matching a flat intrinsic region (of the first intrinsic layer) with the appropriate field developed in the c-region (charge layer). The chirp deposits a net negative charge in the c-region.

In some embodiments, using polar materials that offer p-dopability, the devices are p1-i-c-im-p2 or p-i-c-im structures where holes are injected, and electrons are generated due to impact ionization. In such embodiments, the charge layer is configured to form a positive space charge.

In some embodiments, the requirements of independently controlling the electric field and current injection may be implemented in the charge layer by using AlN/GaN, even in the absence of p-doping. Due to the previously mentioned dependence of GaN and AlN critical fields and the bandgap difference between AlN and GaN, embodiments beneficially start accelerating electrons in AlN and gradually step into a GaN dominated region toward the impact ionization layer. This condition is met by a chirp of the composition in the charge layer, for example from AlN to GaN.

A compositional polarity gradient between AlN and GaN in metal-polar growth is utilized in some embodiments to force an electron barrier to control electron overshoot onset at biases larger than, for example, 5.1 V and provides an electric field to force overshooting electrons to undergo impact ionization.

In some aspects, the AlN to GaN grading in the chirp has electrons gather energy in AlN-rich sections of the semiconductor, gradually entering more GaN-rich regions as their energy rises. Without being limited to theory, this gradual gathering of energy may reduce the likelihood of an electron undergoing thermalization during acceleration, consequently increasing the number of electrons undergoing impact ionization and therefore increasing the number of holes generated.

A graded composition from AlN to GaN in metal polar material forms both an electron barrier and a very high electric field terminating in GaN. Grading in the chirped layer may be achieved in some embodiments by superlattices (SLs), such as short-period superlattices (SPSLs), or by an abrupt change in composition (e.g., from AlN to GaN). A graded composition may enable holes to be more easily transported into the intrinsic region, compared to a stepped composition.

The barrier is controlled by the compositional grading of the two polar materials in the chirp region, such as AlN and GaN, and the ensuing space charge. The space charge is determined by the compositional step, hence some embodiments may use a step from $Al_xGa_{1-x}N$ to $Al_yGa_{1-y}N$ with x>y. This is true for metal polar growth and electrons injected from the 'x' side. The bigger x-y difference, the larger the polarization charge and the larger is its effect on the energy band structure.

GaN and AlN are polar materials that allow the formation of a polarization space charge by changing the composition (e.g., chirp). The same effect can be created in some embodiments by combining other polar materials or a polar and a non-polar material in hetero-epitaxial growth. Example alternative materials are polar oxides (e.g., kappa phase of Al2O3 and Ga2O3) and non-polar oxides (e.g., alpha or beta phase of Al2O3 and Ga2O3) as well as other nitrides (e.g., InN, ScN, BN) and their ternary and quaternary and SL mixes with GaN and AlN. In some embodiments, the first material of the charge layer comprises a polar oxide. The ability to use alternatives to GaN and AlN is beneficially important in enabling a larger number of materials to be used for the generation of light when p-dopability (as in a conventional p-i-n diode) is not a requirement. The added constraint in embodiments that use polar materials is that the material must enable impact ionization at field strengths that are accessible and must have a method of inserting a fixed, permanent space charge (e.g., via polarization chirp) so that a barrier exists for the charge species that is used to do impact ionization. The impact ionization threshold and the barrier must be matched, so that a higher impact ionization threshold must be reflected by a larger space charge.

Charge layers created by chirping shall now be described. In some embodiments, the chirped charge layer has an increasing gradient in a direction from the first intrinsic layer toward the impact ionization layer, where the composition of the chirped layer increases in the amount of the material used in the impact ionization layer. In various embodiments, the gradient of the chirped layer may be continuous, or stepped, or a hybrid. A continuous gradient may involve a SL or SPSL gradually changing in composition across the charge layer. A stepped gradient (i.e., stepped composition) may involve the sub-layers of an SL having a composition that changes in stepped increments across the charge layer (e.g., a first composition for a certain number of periods, a second composition for a subsequent number of periods, etc.). A hybrid gradient may involve some sub-layers being fixed in a particular characteristic and some sub-layers changing in that characteristic. For example, the chirp may have a first material within a SL or SPSL where the first material has a fixed thickness throughout the charge layer, and a second material of the SL or SPSL with a variable thickness across the charge layer. That is, the chirp of the charge layer may be a hybrid gradient in which alternating material layers involve one of the material layer widths (thicknesses) changing while the other material layer widths remain the same. As a specific example, the chirp may have alternating AlN/GaN layers with the GaN layer width changing, such as GaN sub-layers having a variable thickness from 0 monolayer (ML) to, for example, 12 ML, while the AlN sub-layers have fixed thicknesses of 4 ML.

In some embodiments, the first material of the charge layer comprises a chirped composition that is chirped from a first composition near the first intrinsic layer to a second composition away from the first intrinsic layer. In some embodiments, the first composition comprises AlN and GaN; the second composition comprises AlN and GaN; the first composition is higher in AlN content than the second composition; the second composition is lower in AlN content than the first composition; and the chirped composition is metal polar. In some embodiments, the first composition comprises $Al_xGa_{(1-x)}N$ and the second composition comprises $Al_xGa_{(1-x)}N$, where in the first composition, x is higher than in the second composition; and the chirped composition is metal polar. Embodiments also include ternary and SL compositions.

The devices may be grown metal polar on a substrate such as c-sapphire. The growth must use the polarity of the material, such as nitrides for an AlN/GaN system. For nitrogen polar growth the design is adjusted, such as in layer order or charge injection direction. That is, in nitrogen polar growth the electron injection layer is the layer n2 on top of the deposited device layers. From bottom (substrate) to top the layer order is thus first conductivity type layer (n1), impact ionization layer (e.g., GaN in some embodiments), charge layer (e.g., chirp of GaN to AlN), then first intrinsic layer (n2). Embodiments may also include growing the device structure inverted as nitrogen polar and grading from $Al_yGa_{1-y}N$ to $Al_xGa_{1-x}N$ with x>y.

Referring again to FIGS. 1, example structures for the various device layers shall be described. In some embodiments, the first material of the charge layer 150 comprises AlN (i.e., AlN with or without other materials), the second material of the impact ionization layer 160 is GaN (i.e., GaN only), and the light-emitting diode device 100 emits wavelengths from 200 nm to 250 nm, or 200 nm to 270 nm, such as 230 nm or 265 nm.

In another embodiment of FIG. 1, the first conductivity type layer 130 is n-type. The first conductivity type layer 130, the charge layer 150 and the impact ionization layer 160 are short period superlattices of AlN and GaN. A first material of the charge layer 150 comprises a chirped composition having a higher AlN to GaN ratio near the first intrinsic layer 140 than near the impact ionization layer 160. A second material of the impact ionization layer 160 is GaN.

Figure 3:
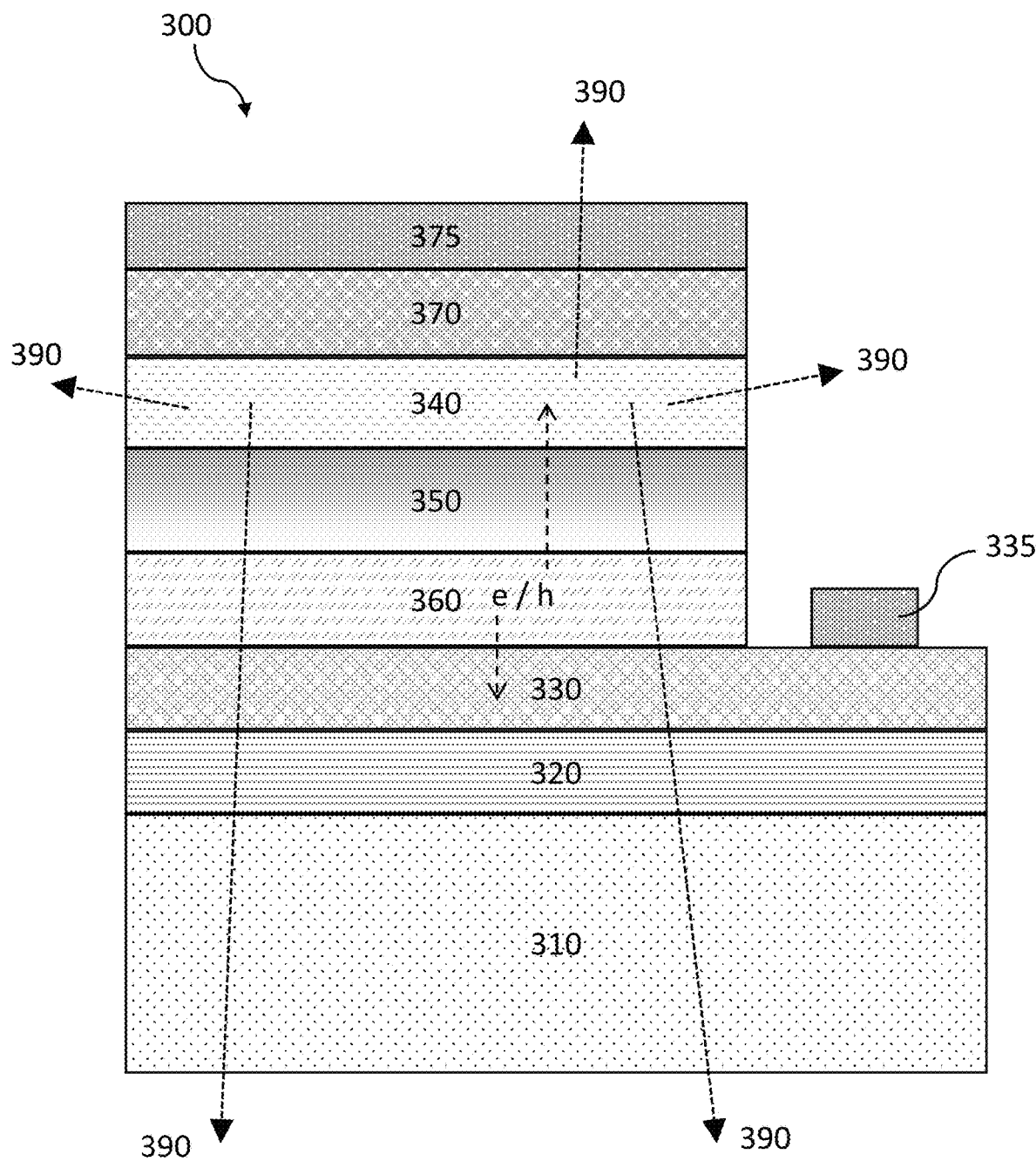
FIG. 3 is a cross-sectional view of another impact ionization LED device structure, in accordance with some embodiments.

FIG. 3 is a schematic of another LED device 300 in which the contacts are reversed; that is, electrons are injected from the top contact. The device 300 uses an AlN ionization layer, and results in a design that is amenable to being a fully transparent light emitter. Similar to FIG. 1, the device 300 has a substrate 310, a buffer layer 320 on the substrate 310, and a layer 330 of a first conductivity type on the buffer layer 320. However, in device 300 an impact ionization layer 360 is on first conductivity type layer 330, followed by a charge layer 350 on the impact ionization layer 360. The impact ionization layer 360 comprises a first material. The charge layer comprises a second material and has a net charge of the first conductivity type. A first intrinsic layer 340 is on the charge layer 350, and a contact layer 370 is on the first intrinsic layer 340. A first contact 335 is on the first conductivity type layer 330, and a top contact 375 is on the contact layer 370. The metals for contacts 335 and 375 may be the same as described for FIG. 1. The charge layer 350 forms a barrier for transporting carriers of the first conductivity type until a bias of at least 1.5 times a bandgap of the first material is applied between the first conductivity type layer 330 and the contact layer 370, and a resulting electric field in the impact ionization layer 360 is greater than or equal to an impact ionization threshold for the first material. The impact ionization layer 360 may be a second intrinsic layer. The contact layer 370 is of the first conductivity type since electrons are injected through the top contact 375.

In device 300, the impact ionization occurs in the wide bandgap material AlN of impact ionization layer 360, and the device 300 is fully transparent to light 390 emitted in the intrinsic layer 340 (for n-SL bandgap in contact layer 370 chosen accordingly to be transparent to the wavelength emitted). The electrodes (e.g., metal top contact 375) may also be configured to transmit light or reflect light. For example, light 390 may be emitted through the top of device 300 in embodiments where the metal for contact 375 is thin enough for this to occur, or where the contact 375 has apertures to allow light 390 through. Because the impact ionization threshold in AlN is higher than GaN and the polarization charge is smaller for short wavelength devices, device 300 may be more beneficial for longer wavelength devices in the AlN/GaN material system than device 100 in which GaN is used for the impact ionization layer 160. In some embodiments, device 300 can utilize other material systems, such as oxides.

The barrier created by the charge layer utilizes a polarity barrier as the primary mechanism due to the net charge of the charge layer. However, a step in composition in the charge layer also creates a compositional barrier, which contributes to the overall barrier. In some embodiments of device 300, the second material of the charge layer 350 comprises a stepped composition that is stepped from a first composition near the impact ionization layer 360 to a second composition away from the impact ionization layer. Interfaces between layers that have steps in composition create compositional barriers for electrons being injected from the contact 375. In some embodiments, the first conductivity type layer is n-type; the first conductivity type layer, the charge layer, the first intrinsic layer and the contact layer comprise short period superlattices of AlN and GaN; the first material of the impact ionization layer is AlN; and the second material of the charge layer comprises a stepped composition having a higher AlN to GaN ratio near the impact ionization layer than near the first intrinsic layer, and the device comprises a metal polar growth.

As discussed above, embodiments of the charge layer may include a chirped layer comprising AlN and GaN. In various embodiments, the chirped layer may be made of ternary or quaternary materials and may also include superlattice and/ or short-period superlattice constructions. The structures or parts thereof disclosed herein can be realized by binary, ternary, quaternary or higher composite materials in growth techniques such as molecular beam epitaxy (MBE), metal organic chemical vapor deposition (MOCVD), metal organic vapor phase epitaxy (MOVPE), sputtering, and chemical vapor deposition (CVD). Embodiments can also include non-SPSL structures, where a typical quantum well (QW) design of the intrinsic layer can be employed without affecting the functionality of the impact ionization in the embodiments disclosed herein.

In embodiments involving SL structures for an AlN/GaN-based device, a repeating unit of a SL may consist of one GaN monolayer or less (e.g., fractional amounts) and "x" monolayers of AlN, with x being large. For example, GaN may be 0.1 to 1.0 ML, and AlN can be 4 to 30 ML. In a non-limiting example, the repeating unit may consist of a 4 ML AlN layer and a GaN layer having a length (i.e., layer thickness) that is increased across the chirped region from 0 to 10 ML or to 20 ML. The SL is then followed by 100% GaN in the impact ionization layer. An advantage of maintaining a superlattice is transverse electric (TE) based emission, which emits light predominantly vertically (along c-axis), avoiding total internal reflection and absorption.

For superlattice structures the light emission is TE mode, which essentially means light is emitted vertically away from the device. In ternary mix devices the emission is dominantly transverse magnetic (TM) for high AlN compositions, which means the light is emitted in the plane of the wafer.

Instead of a ternary mix it is also possible to use a SL compositional chirp, as described above. This is true for previously mentioned metal polar and nitrogen polar growths.

The chirped layer of the devices can be made of various materials, where in some embodiments the two materials forming the gradient are polar, and the spontaneous polarization differs between the two materials. An example is AlN/InN, or AlInGaN in a quaternary mix or superlattice. Ga2O3 is another material which is polar in the kappa phase. Other polar oxides that may be used are BeO and ZnO in wurtzite structure.

It is also important that the only region to be required as direct bandgap semiconductor is the first intrinsic region, while the charge region (e.g., chirp region), the top contact layer (e.g., n region) and the impact ionization region can be indirect semiconductors grown in heteroepitaxy methods. The impact ionization region can also be amorphous.

The thickness of the impact ionization layer (i.e., second intrinsic layer) determines the operating bias and charge generation of the device. Additional parameters that can be used to tailor the electric field and barrier are the length of the chirp and the profile of the compositional change (i.e., the detailed layer thickness changes). These parameters do not affect the general function but fine-tune the voltage and impact ionization efficiency and may also affect lifetime of the device.

Instead of a compositional polarity gradient, the fixed internal charge in the charge layer may be created by doping in some embodiments. For example, in some embodiments the first conductivity type is n-type, and the first material is p-doped. The charge layer may be partially p-doped to increase the deposited charge, where p-doping adds negative (fixed) charge. Unbiased, free positive charge (holes) compensate the negative fixed charge, and thus holes are conventionally available in p-doped semiconductors. However, with an electric field applied as in the present devices, the free charges leave, and the fixed charge remains. In an example of doping, for an impact ionization LED device formed using n-doped metal polar nitrides, a first material in the charge layer may be p-doped using Mg in nitrides.

In some embodiments, the impact ionization layer may be partially p-doped on the chirp side of the impact ionization layer (i.e., toward the charge layer) to increase the deposited charge of the charge layer.

Figure 4:
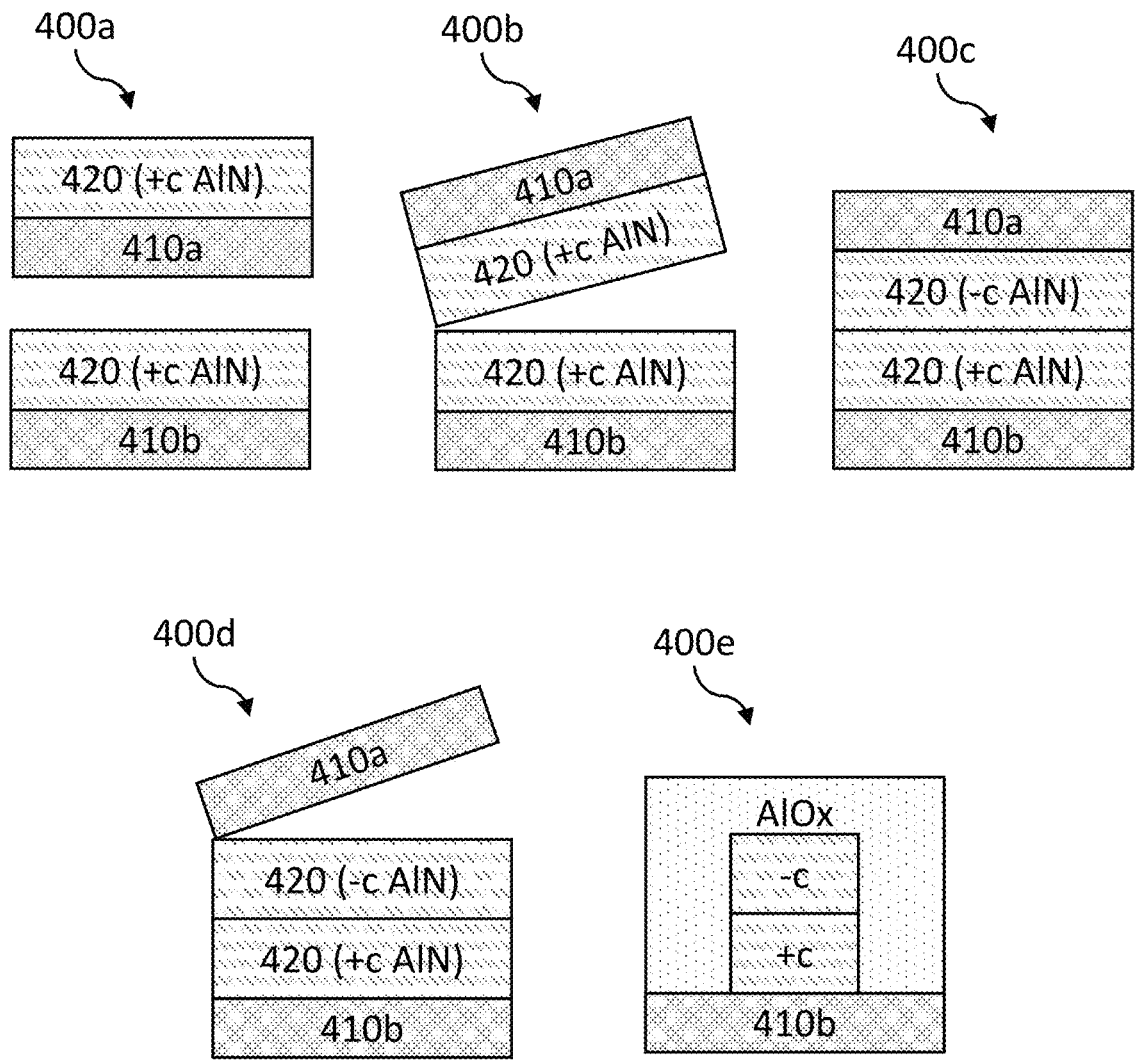
FIG. 4 is a schematic of process steps for creating polarity inversion, as known in the art.

The effect of the chirp is to deposit a fixed charge. In some embodiments, the chirp can be replaced by the inversion of the polarity during growth of the semiconductor or due to the post growth bonding of two semiconductor devices. Embodiments also include short wavelength (e.g., 210-230 nm) LEDs with an AlN-only device, using reversal of polarity—also referred to as polarity inversion. Hayashi et al. ("Polarity inversion of aluminum nitride by direct wafer bonding," Applied Physics Express 11, 031003, 2018) describes a technique to achieve polarity inversion using direct wafer bonding, shown in FIG. 4. In this process to form an inverted polarity AlN layer, an AlN target 420 was sputtered onto c-plane sapphire substrates 410a, 410b (step 400a). The sputtered wafers were then stacked with the AlN layers facing each other as shown in step 400b, and the stack annealed to perform direct wafer bonding (step 400c). One sapphire substrate 410a was then removed (step 400d) to enable fabrication of an optoelectronic device (step 400e), such as quasi-phase matching (QPM) for second harmonic generation (SHG).

Figure 5:
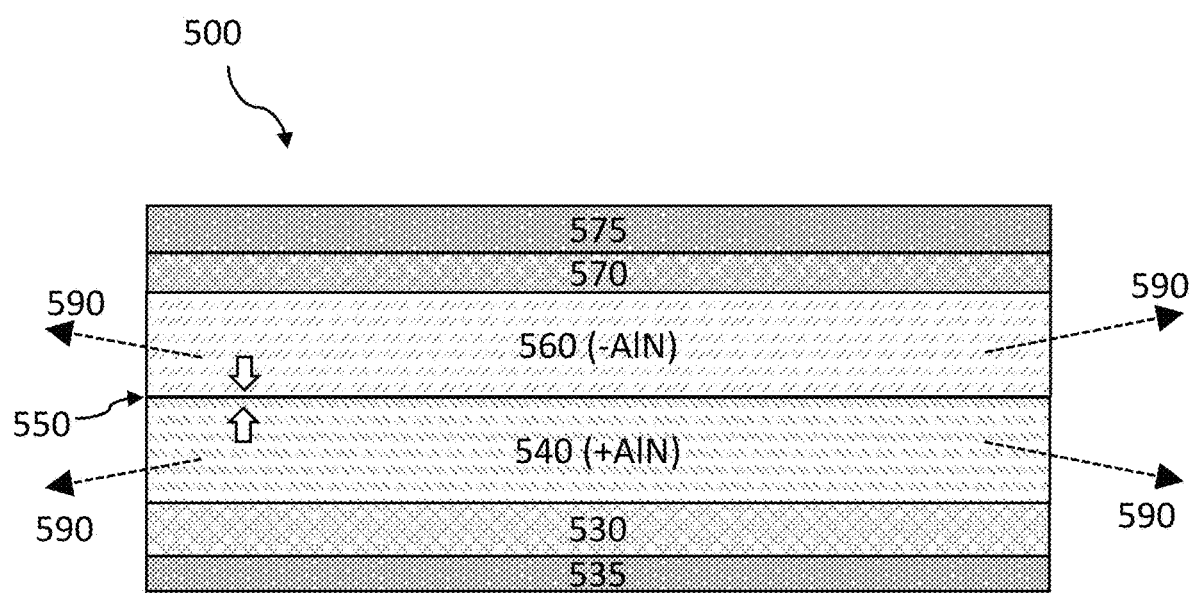
FIG. 5 is a cross-sectional view of an impact ionization LED device structure using polarity inversion, in accordance with some embodiments.

FIG. 5 shows a cross-sectional view of an impact ionization LED device structure 500 according to some embodiments, utilizing the principle of polarity reversal to create a polarization charge as the barrier to current flow. The device structure 500 is a TM emitting, AlN-only device with polarization charge provided by a reversal of the polarity of the AlN layer. The polarization charge enables impact ionization as described above, by allowing a high enough electric field to build for impact ionization to occur. The structure 500 of FIG. 5 has a metal layer (i.e., metal contact 535) followed by a first conductivity layer 530 of n-AlN, a metal polar layer 540 of AlN ("+AlN"), a nitrogen polar layer 560 of AlN ("−AlN"), a contact layer 570 of n-AlN, and a top metal contact 575. The interface 550 between the two polar layers 540 and 560 creates a barrier for current flow, thus functioning as the charge layer of the previous embodiments. Since only AlN is used and Al reflects light 590, the device structure is a non-absorbing edge emitter of, for example, 210 nm.

The device structure 500 is symmetric and thus can inject electrons from the top or the bottom. For example, impact ionization may occur in nitrogen polar layer 560 with recombination occurring in metal polar layer 540, or vice versa. The interface between the intrinsic layer and the impact ionization layer forms a barrier for transporting carriers in the device. In a first case, if layer 540 is metal polar and layer 560 is nitrogen polar (N-polar), then an electron barrier is formed regardless of which side is biased, and the anode side functions as the impact layer and the cathode side functions as the recombination layer. In a second case, if layer 540 is N-polar and layer 560 is metal polar, then a hole barrier is formed, and the cathode side is the impact layer and the anode side is the recombination layer. This is due to the direction from which a charge (electron in first case, hole in second case) is injected. In the first case it always encounters a metal polar layer (from the direction of its travel), while in the second case it always encounters an N-polar layer.

In embodiments of the polarity reversal impact ionization device, the structure 500 includes a first conductivity type layer 530, an impact ionization layer (e.g., metal polar layer 540 or a nitrogen polar layer 560) on the first conductivity type layer, an intrinsic layer (e.g., nitrogen polar layer 560 or metal polar layer 540) on the impact ionization layer, a contact layer (e.g., contact layer 570) on the intrinsic layer, and an interface between the intrinsic layer and the impact ionization layer. The intrinsic layer comprises a first material and has a first polarity, and the impact ionization layer comprises a second material and has a second polarity that is reversed from the first polarity. The reversal of the first polarity to the second polarity at the interface creates the barrier for transporting carriers of the first conductivity type until a bias of at least 1.5 times a bandgap of the second material is applied between the first conductivity type layer and the contact layer, and a resulting electric field in the impact ionization layer is greater than or equal to an impact ionization threshold for the second material. The first material and the second material may both be AlN.

In FIG. 5, the metal layers (contacts 535 and 575) are electrically conductive, and at least one metal layer may be reflective to the wavelengths being generated by the device structure. For example, at least a portion of the top metal contact 575 can be formed using Al for highly optical reflective operation in the 190 nm to 280 nm wavelength region, while a portion of the top metal contact 575 can be formed as an ohmic contact using a material that is not optically reflective. The additional reflections may improve efficiency by increasing the amount of light exiting the device structure.

Variants of other device structures in accordance with the present disclosure include other materials (e.g., oxides, fluorides), growing N-polar and grade up, and variations on the vertical structure.

Structural variations disclosed herein for nitride-based impact ionization devices may apply to oxide-based embodiments, such as using different majority charge carriers (n-type or p-type devices), polar and non-polar material combinations, superlattices, ternary or quaternary materials, mixtures with nitrides, and creating fully transparent light emitting devices.

The realization of impact ionization devices in oxides may include combinations of polar oxides and also non-polar oxides, as impact ionization is a pathway to generate light in non p-dopable oxide materials. Embodiments for sub-materials of the material of the charge layer include a chirp or an interface between a first polar oxide and a second polar oxide, between a polar oxide and a non-polar oxide, or a non-polar oxide and a polar oxide. Achieving p-dopability is the main concern in oxide material development. In general, the p-doping of wide bandgap semiconductor materials is a well-known issue. The techniques of the present disclosure offer an alternative. Application of LEDs in the present disclosure to oxides is advantageous as the p-doping of oxides in the industry has been elusive in wide bandgap oxides.

A compositional grading with polar oxides may create a similar effect as described above with nitrides, allowing control of the impact ionization efficiency at a given overflow current. As no acceptor dopant is needed, this provides a route to form emitting wide bandgap oxide semiconductors. Some embodiments may utilize two oxides having different polarization strengths and compatible heterogeneous growth. Some embodiments may utilize a mix of a polar and a non-polar oxide when grown heterogeneously.

A polar, transparent device is also possible when the emission occurs in the narrowest bandgap layer.

In some embodiments, impact ionization LEDs are created using only non-polar materials such as non-polar oxides. In such embodiments, non-polar materials are used in hetero-epitaxial growth, and a barrier to current flow is created by a step in the band energies between heterogeneous non-polar materials. In other words, an interface between two different non-polar materials creates a compositional barrier that is the primary barrier mechanism to block current flow, serving the same function as a charge layer of previous embodiments. Some embodiments include oxides in various crystal phases (including phases that are inherently direct in bandgap), in various heterogeneous compositions and/or multilayer heterogeneous builds for the first intrinsic layer, impact ionization layer, and optionally other layers of the device. Embodiments include combinations of various oxides in various phases, to create a UVC LED without p-doping. Example oxides include $Ga_2O_3$, MgO, ZnO, and $Al_2O_3$, and embodiments also include SL formulations of oxides. In embodiments, a non-polar oxide impact ionization LED layer stack is structured as: i) a growth substrate, ii) buffer, iii) n-layer, iv) impact ionization non-polar oxide layer, v) intrinsic light generating layer (non-polar oxide, direct bandgap) with narrower bandgap than the impact ionization layer, and vi) a slightly wider bandgap layer of n-doped oxide than the bandgap of the intrinsic (recombination) layer. Inverted embodiments of this structure are also included, where the intrinsic layer (now layer (iv)) is a narrow bandgap non-polar oxide under (closer to the substrate) a wide bandgap impact ionization layer (now layer (v)).

In impact ionization devices built with a compositional barrier (e.g., non-polar oxides such as alpha or beta $Ga_2O_3$ and $Al_2O_3$), the electron barrier formed by composition is configured to control the electron current/field strength parameter. Such embodiments enable fully transparent devices because a GaN-only layer (which absorbs short wavelength light) can be omitted.

Figure 6:
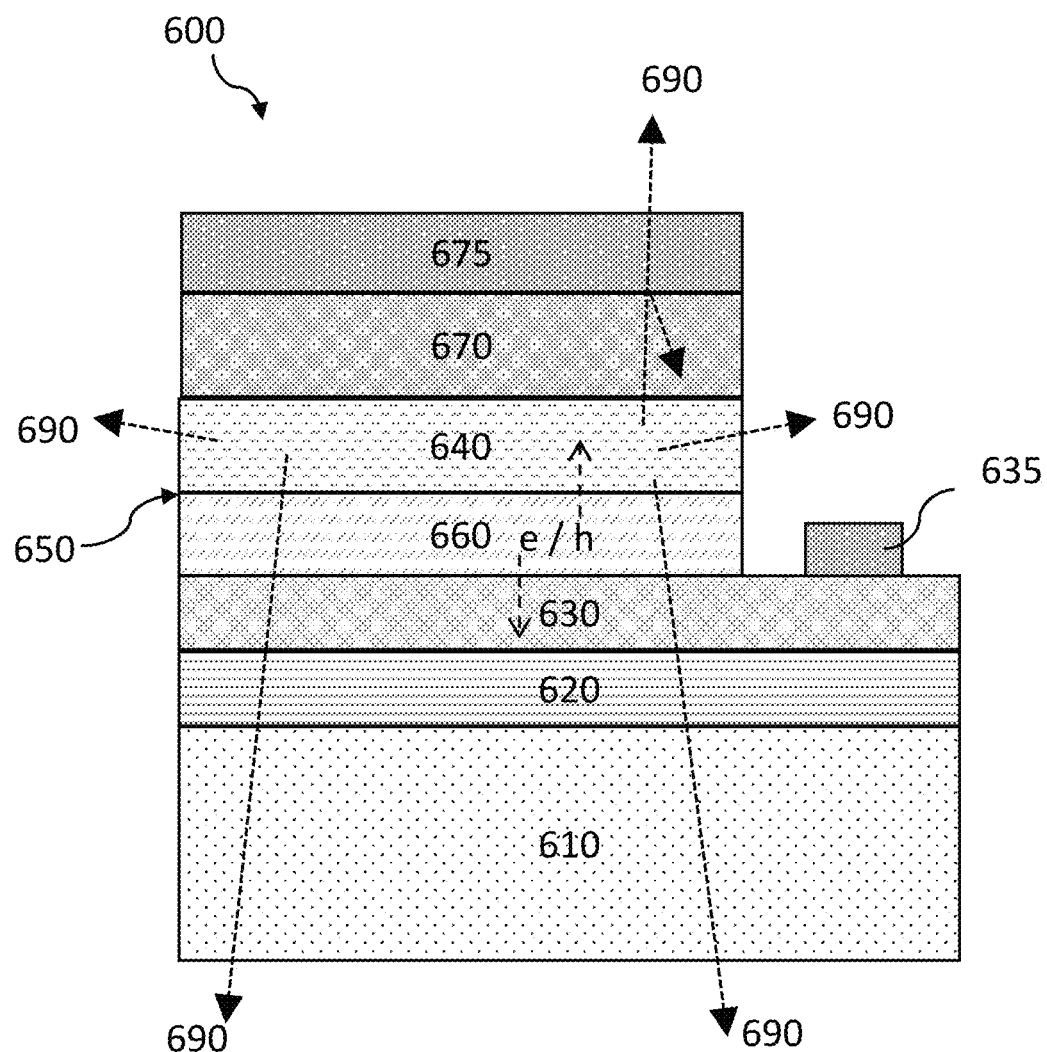
FIG. 6 is a cross-sectional view of an impact ionization LED device using a compositional barrier, in accordance with some embodiments.

FIG. 6 is a cross-sectional schematic of a device 600 that uses non-polar oxides for an impact ionization LED, in accordance with some embodiments. Device 600 includes a substrate 610, a buffer layer 620 on the substrate 610, and a first conductivity type layer 630 on buffer layer 620. The first conductivity type layer 630 may be, for example n-type and serves as a conductive layer for contact 635. Device 600 also includes a first intrinsic layer 660 on the first conductivity type layer 630, a second intrinsic layer 640 on the first intrinsic layer 660, a contact layer 670 (e.g., n-type) on the second intrinsic layer 640, and a top contact 675 on the contact layer 670. First intrinsic layer 660 comprises a first material of a first composition, and second intrinsic layer 640 comprises a second material of a second composition that is heterogeneous from the first composition. Either the first intrinsic layer 660 or the second intrinsic layer 640 may be the impact ionization layer, depending on the direction of electron injection. In some embodiments, first intrinsic layer 660 is the impact ionization layer while second intrinsic layer 640 is the light generating (recombination) layer where electron-hole recombination occurs; and the first material of the impact ionization layer has a wider bandgap than the second material so that a barrier is formed for the first conductivity type. In other embodiments, second intrinsic layer 640 is the impact ionization region while first intrinsic layer 660 is the light generating layer where electron-hole recombination occurs. In some embodiments, the first material and the second material are non-polar oxides. In some embodiments, the non-polar oxides comprise at least one of: α-Ga2O3, β-Ga2O3, α-Al2O3 or β-Al2O3. Contacts 635 and 675 are metal. Light 690 is generated in the intrinsic layer 640.

In the embodiment of FIG. 6, current is blocked by a barrier created at the interface 650 between impact ionization layer (e.g., layer 660) and intrinsic layer (e.g., layer 640). When the required bias is applied to contacts 635 and 675 (i.e., above a minimum threshold to meet electric field requirements for impact ionization and voltage requirements for the device), the barrier (interface 650) allows electrons to enter the impact ionization region where holes are generated and drift back toward the intrinsic layer 640, to recombine and generate light 690. That is, a compositional step between the first composition and the second composition at the interface 650 creates a barrier for transporting carriers of the first conductivity type until a bias of at least 1.5 times a bandgap of the second material is applied between the first conductivity type layer and the contact layer, and a resulting electric field in the impact ionization layer is greater than or equal to an impact ionization threshold for the second material.

Light 690 can be transmitted in all directions in embodiments where the layers are chosen to be fully transparent to the generated wavelength. For example, intrinsic layer 640 may be alpha Ga2O3 and impact ionization layer 660 may be alpha Al2O3. N-doped first conductivity type layer 630 may be Al2O3; however, embodiments of first conductivity type layer 630 may also use Ga2O3 or ternary (quaternary, SL, etc.) mixes of Al2O3 and Ga2O3 as long as the n-layer composition is non-absorbing to the target wavelength being produced. In some embodiments, light 690 may be reflected at an aluminum top electrode (i.e., top contact 675) for enhanced emission. Such embodiments involve n-doping of Ga2O3 and impact ionization in Al2O3.

EXAMPLES

Impact ionization LEDs were demonstrated in a device structure similar to the chirped device structure of FIG. 1, with an n-i-c-im-n structure.

Table 1 below shows the layer stack which was used, listed in the growth direction (from the substrate up). A 150 mm diameter wafer with this layer stack was created, with many die formed from the wafer. The devices (die) demonstrated good emission at approximately 235 nm, with high output power and >7.5V onset of emission.

TABLE 1

| # | Layer | Thickness | Function |
|---|---|---|---|
| 1 | Sapphire | 625 μm | Substrate |
| 2 | AlN | 400 nm | Buffer layer |
| 3 | n-SL: AlN and GaN alternating SPSL, n-doped | three layers: 400 nm + 50 nm + 30 nm (varying composition in the layers) | Lateral conductive layer |
| 4 | i-SL: AlN and GaN alternating SPSL | 50 nm | Intrinsic layer where recombination occurs |
| 5 | Chirp: AlN and GaN alternating SPSL starting with high AlN content and ending with high GaN content | 20 nm | Charge layer, creates polarization charge in device |
| 6 | GaN | 40 nm | Impact ionization layer |
| 7 | GaN n-doped layer | 40 nm | Contact layer |

The i-SL and n-SL design details were chosen based on the target wavelength to be produced but do not affect the functionality of the impact ionization. The growth is metal polar. Layer 6 is responsible for the generation of holes via the impact ionization process. Due to the design, the voltage between the layers 3 and 7 is mostly dropping off in layer 6. A high electric field in layer 6 can thus be generated so that it exceeds the threshold for impact ionization for electrons in GaN. A minimum thickness of the GaN layer 6 is required in order to allow the electrons to gain enough energy to exceed the band to band energy requirements for impact ionization. This is typically 1.5 times the bandgap.

Other thickness ranges are possible from those shown in Table 1. Similarly, other variations of layers 1-5 are also possible within the general framework of layer requirements described herein regarding layer thicknesses, composition and the like. For example, 265 nm impact ionization devices and 235 nm impact ionization devices were built by varying the i-SL and n-SL layer compositions.

Figure 7:
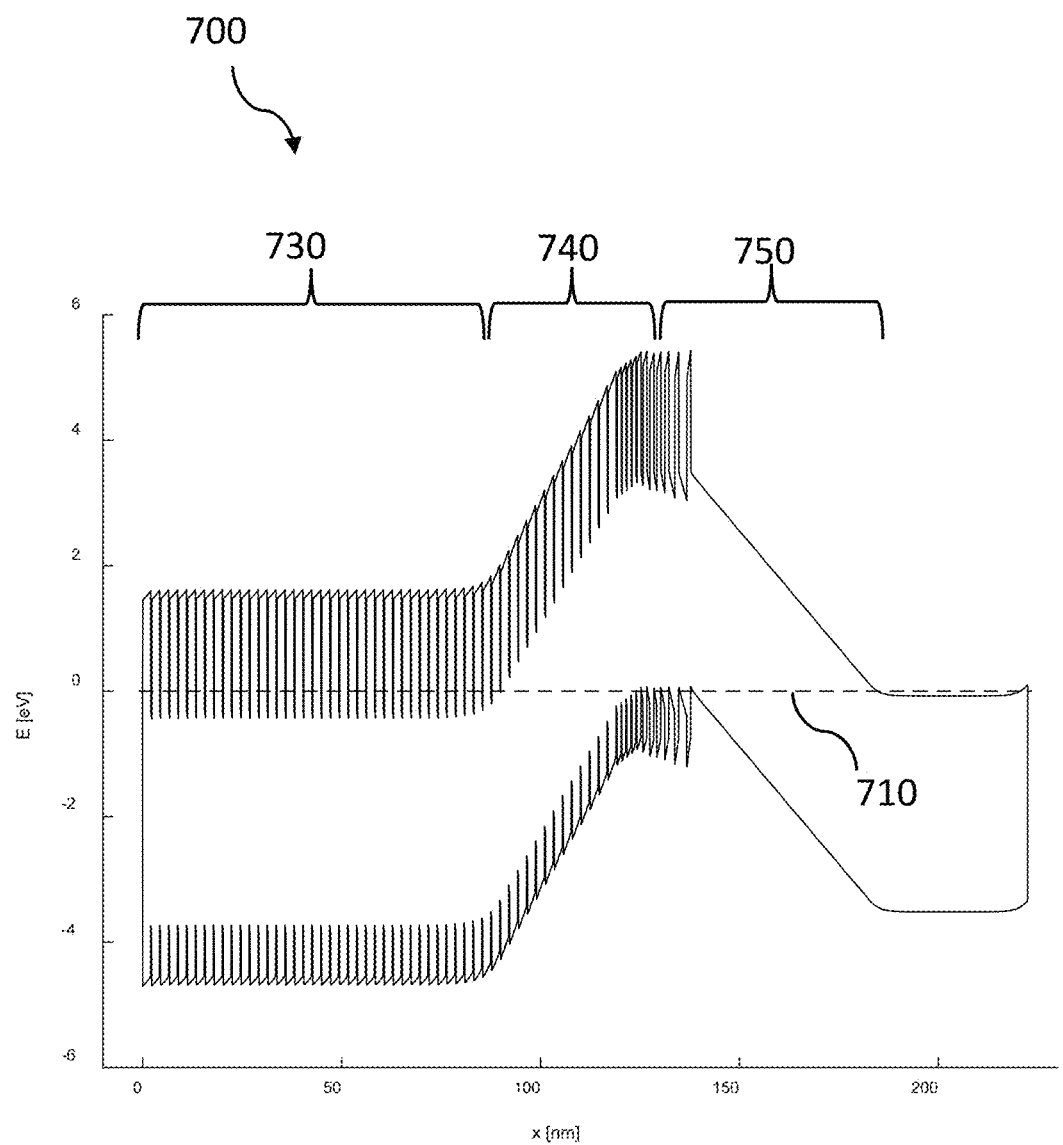
FIG. 7 is a band diagram of an impact ionization device with no voltage applied, in accordance with some embodiments.

FIG. 7 is a band diagram 700 of energy level (units of eV) versus position in the device stack (nm) starting at layer 3. The dashed line 710 indicates the Fermi level. The band diagram 700 is at 0 V for the device structure of Table 1. In FIG. 7 the n-SL 730 (layer 3) is shortened and simplified for ease of illustrating the figure; that is, the n-SL region is represented by a 90 nm thickness and single composition (0.25:2). The i-SL region 740 is between the n-SL 730 and charge layer 750 (layer 5 of Table 1). The potential barrier caused by the charge layer 750 inhibits current flow at low biases.

Figure 8:
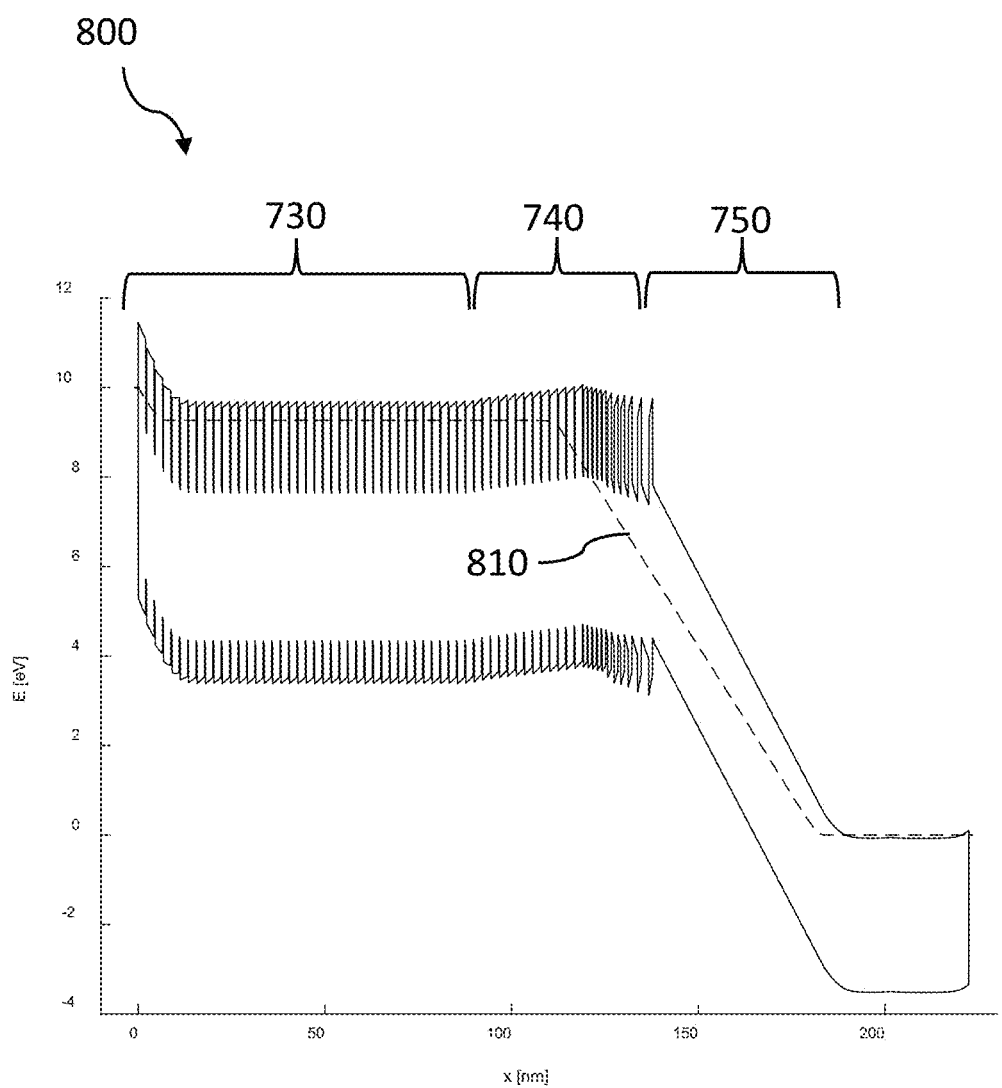
FIG. 8 is a band diagram for the device of FIG. 7 with voltage applied that meets a biasing threshold, in accordance with some embodiments.

FIG. 8 is a band diagram 800 at 10 V for the device of FIG. 7, where the dashed line 810 is the Fermi level for electrons. The potential barrier has flattened, and the electric field in the impact ionization region made of GaN is 1.6 MV/cm. The recombination region (i-SL region 740, layer 4) is almost flat, suggesting that current is starting to flow and light is being emitted.

FIG. 9 is a typical current-voltage (IV) curve 900 for a 1 mm2 impact ionization device of Table 1. Compared to a conventional pn-LED, the voltage at maximum current is raised by about 4 V, demonstrating the higher bias needed in the impact ionization region for the hole generation.

Figure 10:
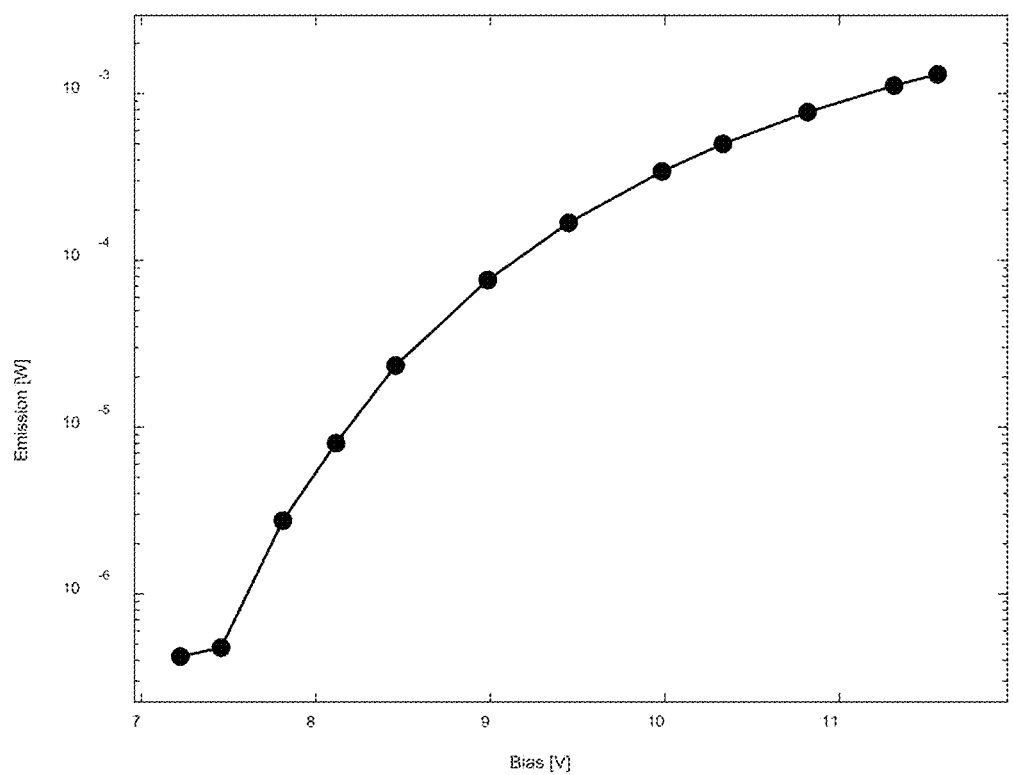
FIG. 10 is a graph of emitted power for an example impact ionization device, in accordance with some embodiments.

FIG. 10 is an emission-voltage diagram 1000 for the device of FIG. 9, showing the integrated emitted power (Watts) as per bias applied. The emitted power is equivalent to LEDs made in conventional pn-technology, demonstrating the comparable functionality of the present impact ionization devices.

Figure 11:
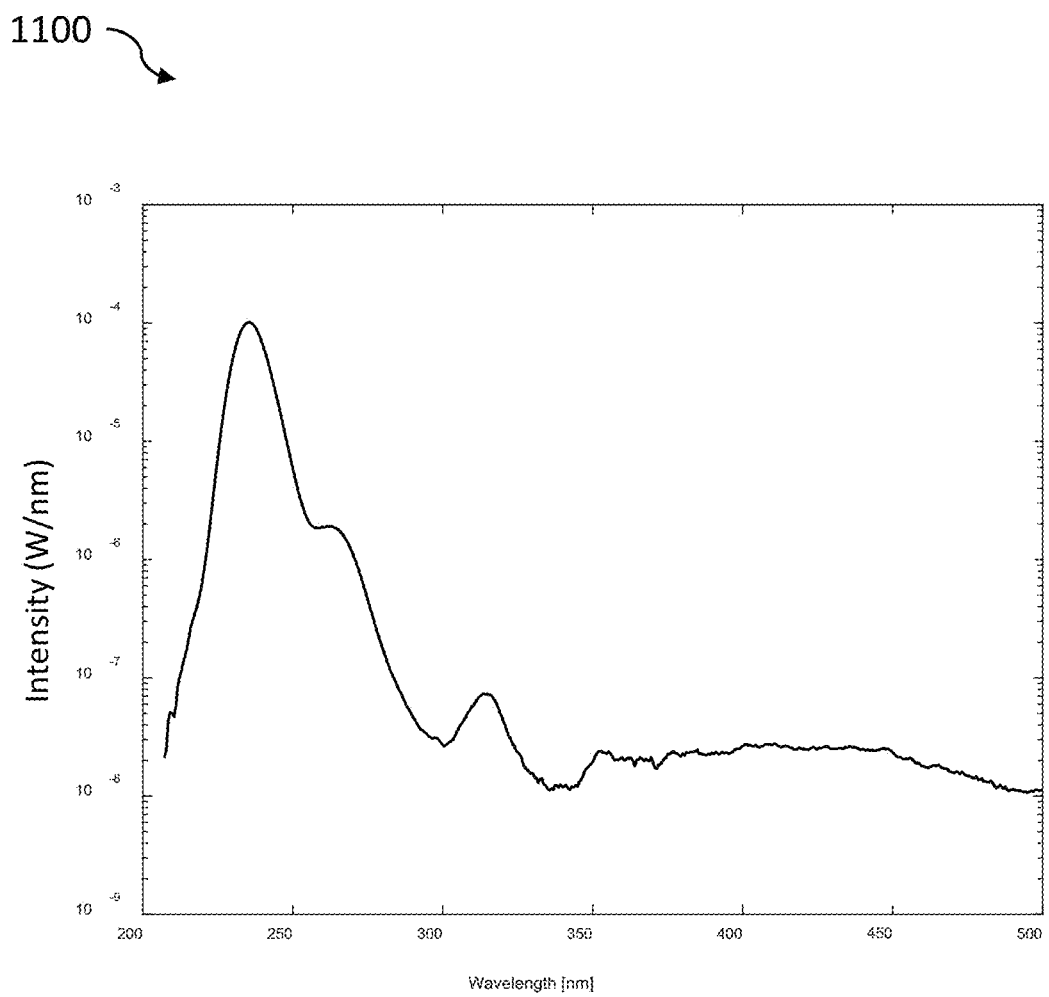
FIG. 11 is a graph of an emitted spectrum for an example impact ionization device, in accordance with some embodiments.

FIG. 11 is an example emitted spectrum 1100 of intensity (W/nm) versus wavelength for the impact ionization device of FIG. 9, showing a peak emission at approximately 235 nm at 100 mA current.

Figure 12:
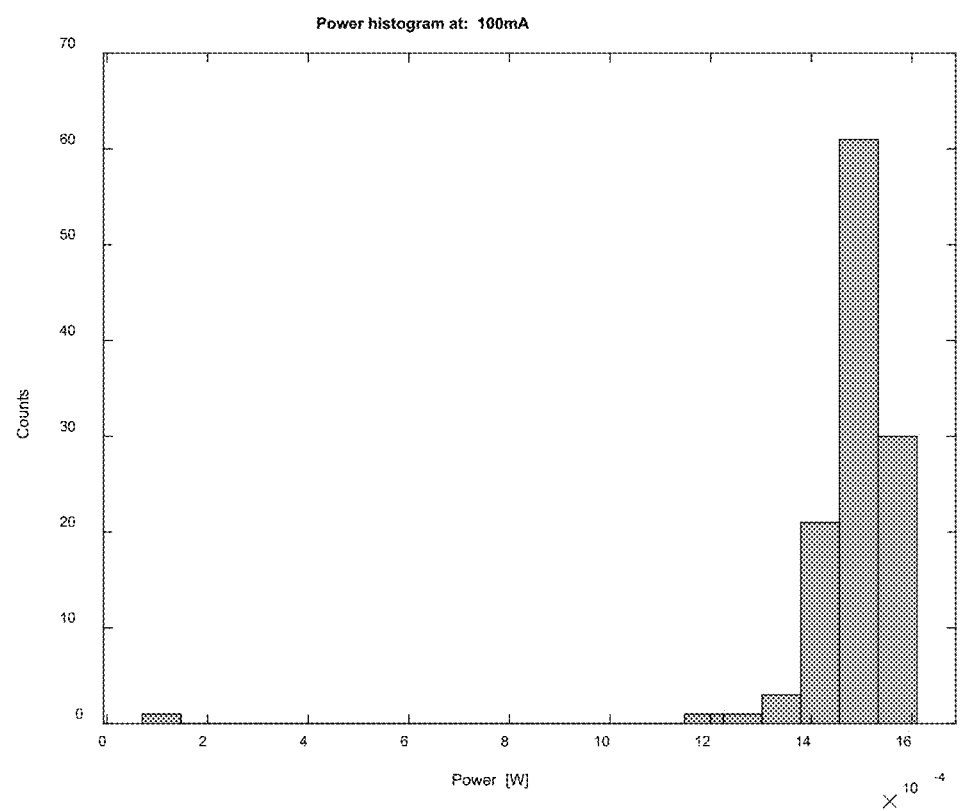
FIG. 12 is a power histogram of example impact ionization devices, in accordance with some embodiments.

FIG. 12 is a power histogram 1200 at 100 mA of all tested die inside a 30 mm concentric region near the center of the 150 mm diameter wafer of Table 1. The narrow clustering of results in the histogram demonstrates that most die show very consistent performance and good yield.

Figure 13:
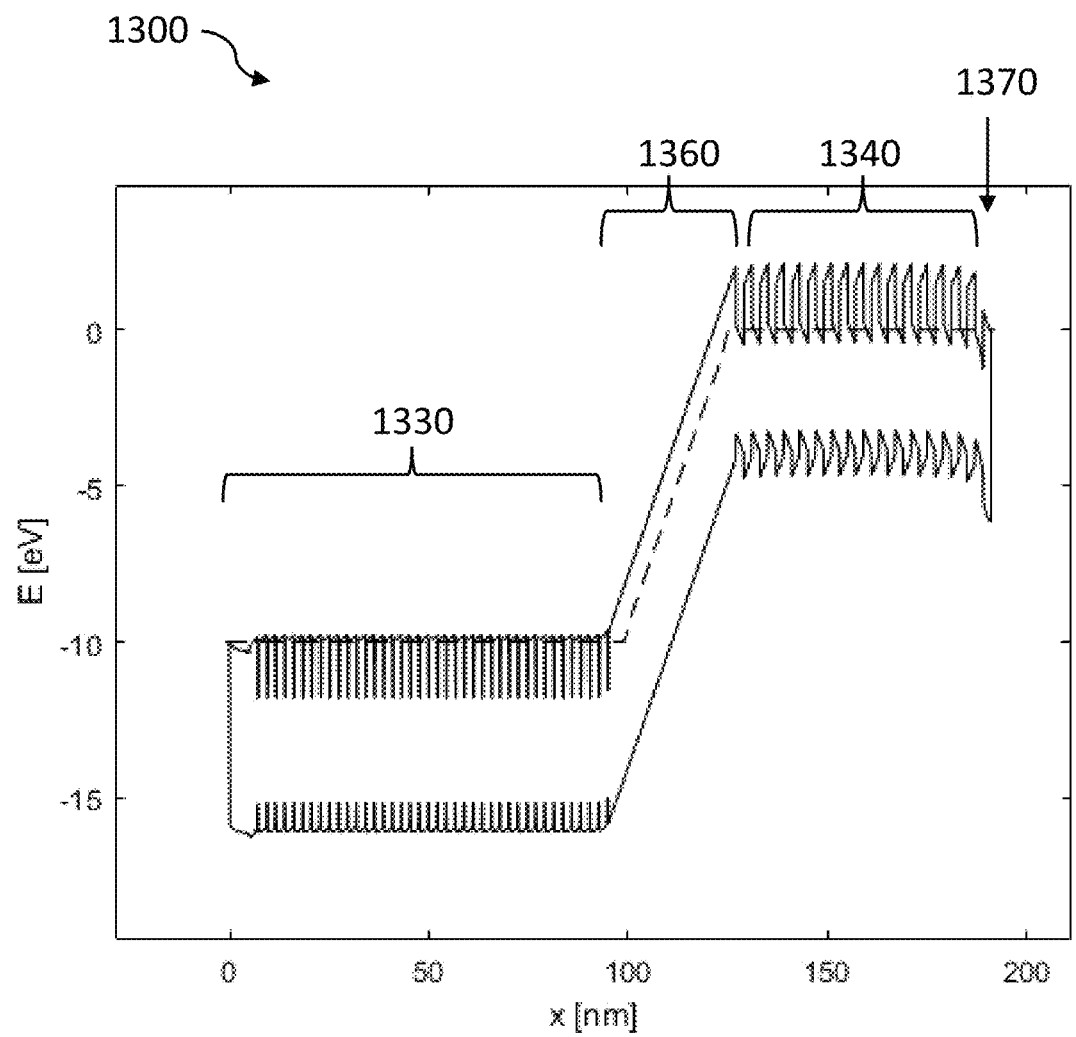
FIG. 13 is an example band diagram of an impact ionization device having an AlN impact ionization layer, in accordance with some embodiments.

FIG. 13 is a simplified band structure 1300 for a device of a different construction than Table 1, having a structure similar to that shown in FIG. 3. FIG. 13 is for a n1-SL/AlN/i-SL/n2-SL impact ionization device where the electrons are injected from a metal contact into n2-SL layer 1370, populate i-SL layer 1340 and generate holes in the AlN 30 nm thick impact layer 1360. Electrons then leave the device through n1-SL 1330. For simplicity, the simulation assumes ideal metal-n-SL contacts. The electric field in AlN is 3.66 MeV/cm and the bias drop is about 10 V, which is enough to see hole generation in AlN. The current through the device is dominated by the tunneling current through the i-SL. In general, for smaller bandgap in the intrinsic layer, the barrier to electron transport will be bigger, and higher fields can be achieved.

Figure 14:
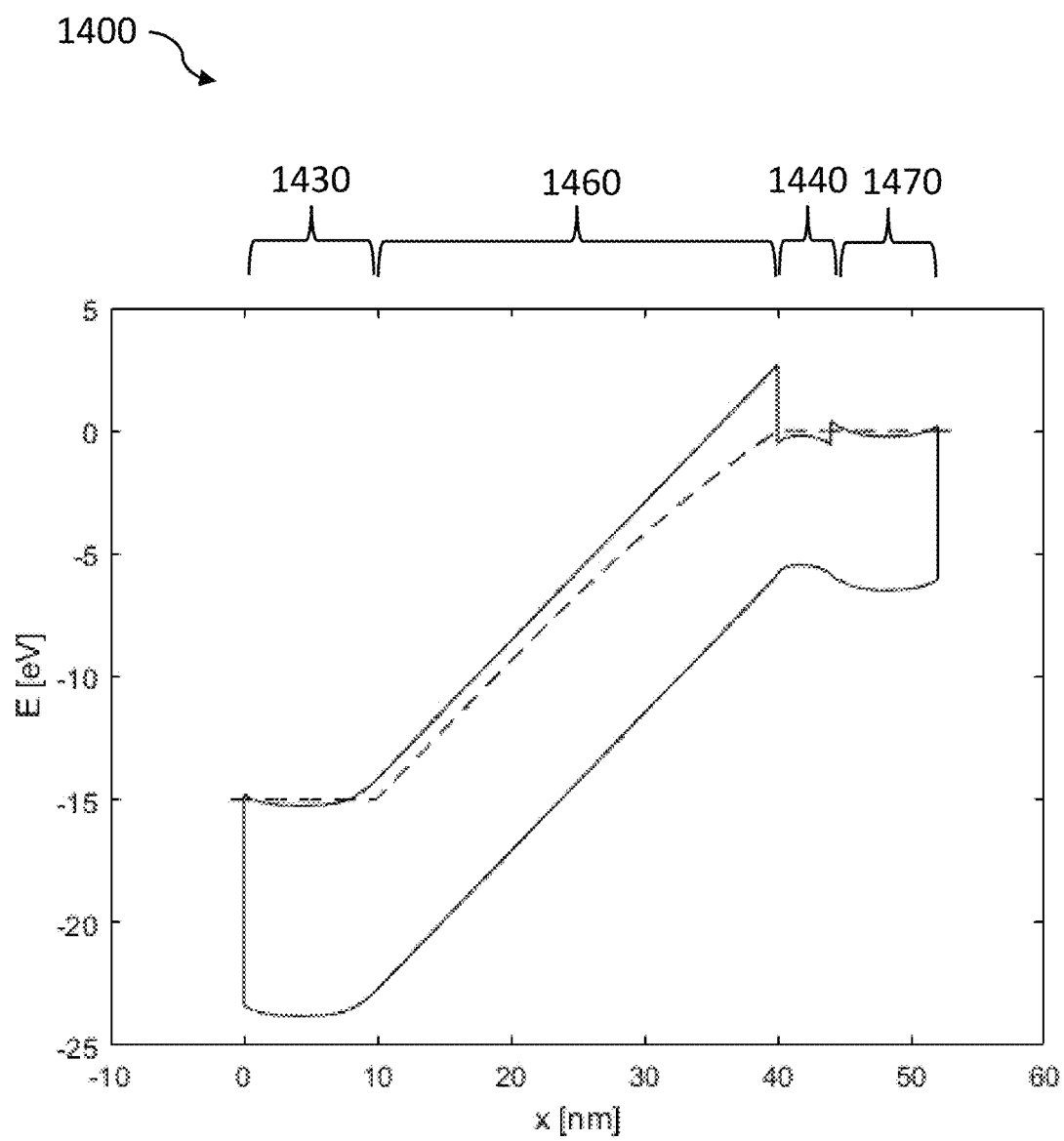
FIG. 14 is an example band diagram of an impact ionization device using a compositional barrier and having an AlN impact ionization layer, in accordance with some embodiments.
Figure 15:
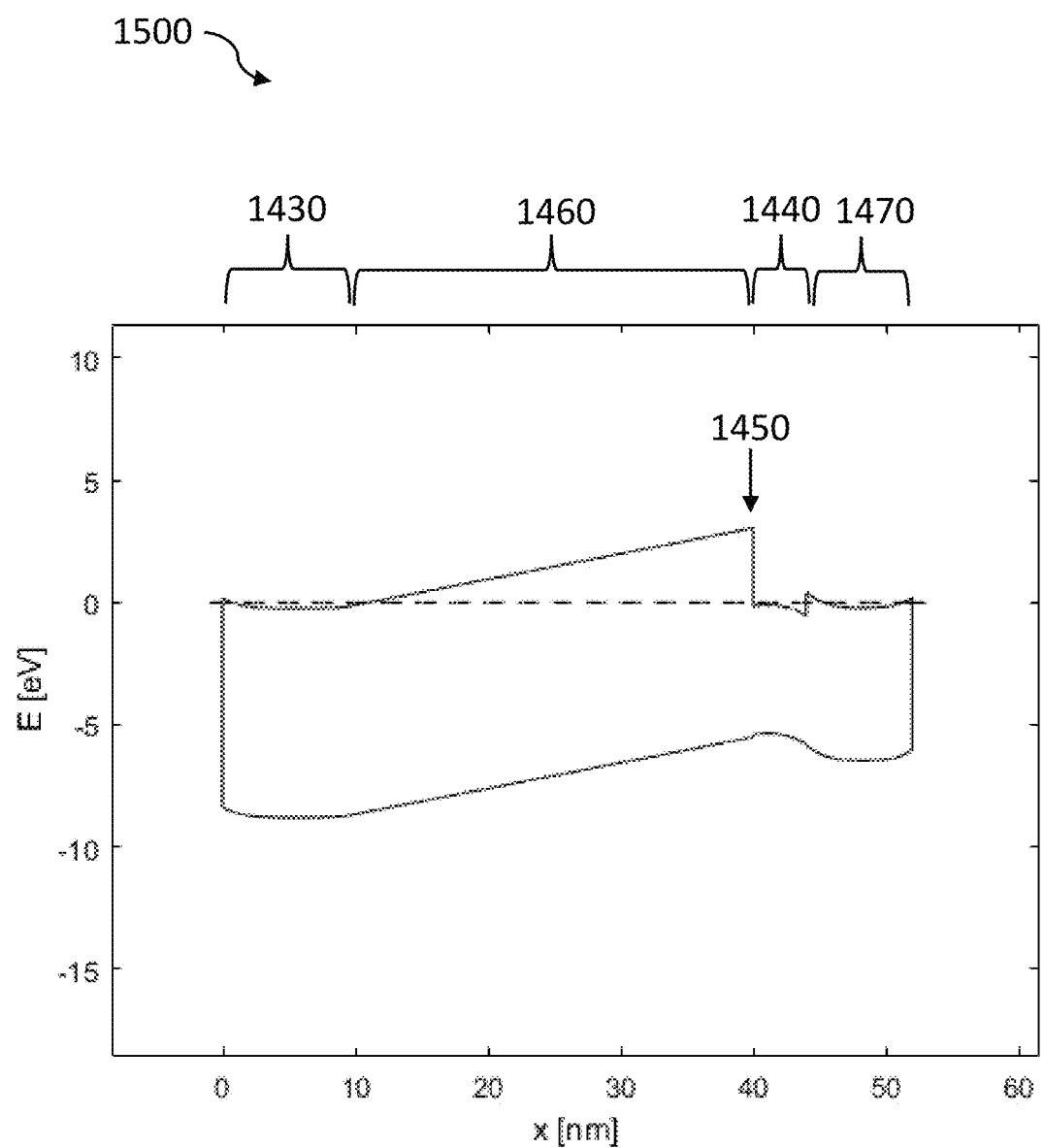
FIG. 15 is band diagram of the device of FIG. 14 with no voltage applied, in accordance with some embodiments.
Figure 16:
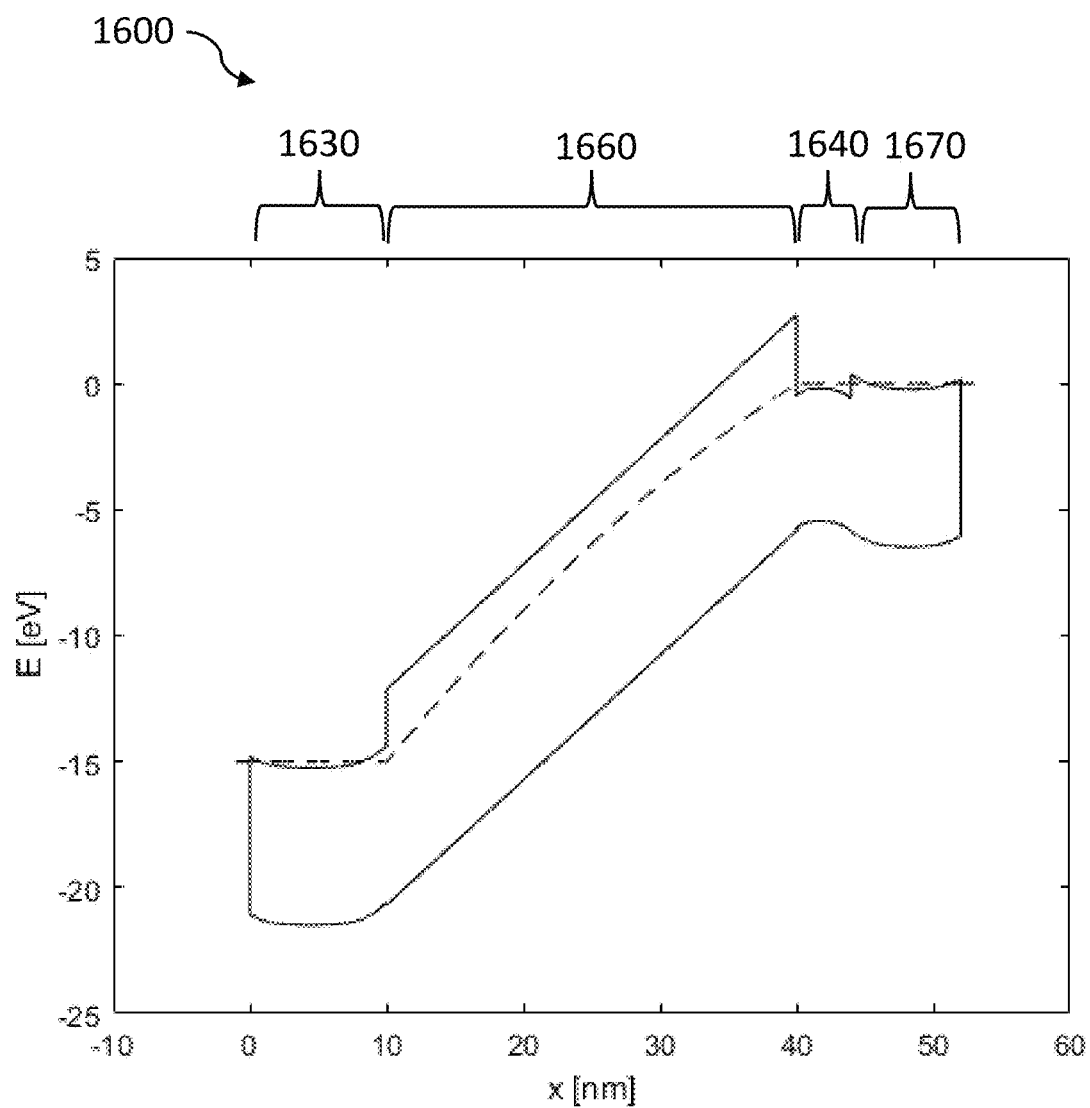
FIG. 16 is an example band diagram of another impact ionization device using a compositional barrier, in accordance with some embodiments.

FIGS. 14-16 provide simulated data for a non-polar oxide device. FIG. 14 shows a band structure 1400 of heteroepitaxial layers of alpha Ga2O3 and alpha Al2O3 and a ternary mix of alpha Ga2O3 and alpha Al2O3. From left to right, the structure includes n-layer 1430 (10 nm of Al2O3 n-doped), impact ionization layer 1460 (30 nm of Al2O3 intrinsic), intrinsic layer 1440 (3 nm of Ga2O3 intrinsic), and a contact layer 1470 (8 nm of (Al$_x$Ga(1-x))2O3 x=0.3 n-doped). The contacts to metal are not shown; 0.2 eV Schottky. The barrier that is formed for electrons enter the semiconductor from the right. The barrier is also present at zero bias in the band structure 1500 of FIG. 15.

At the correct bias the barrier will allow electrons to enter the impact ionization region (layer 1460) of Al2O3 where the holes are generated and successively drift back toward the intrinsic Ga2O3 layer 1440. The current threshold will be defined by thermal and tunneling current at the interface barrier 1450. The difference in energy is determined by the difference of the conduction band between Al2O3 and Ga2O3. This barrier can be modified as required by the choice of the relative materials or ternary or SL or quaternary or higher mixtures. Most notably and contrary to conventional LEDs, the structure of FIGS. 14-15 is transparent to the light emitted in the intrinsic recombination layer (i-Ga2O3).

FIG. 16 shows a simulated band structure 1600 similar to that of FIGS. 14-15 but having an additional ternary mix n-layer 1630 of 30% Al and 70% Ga in (AlGa)2O3 (contact layer 1670 is also a ternary mix as described for FIGS. 14-15). The intrinsic layer 1640 Ga2O3 can also be modified to emit shorter wavelengths via the use of narrow quantum well in SL structure or the use of ternary (or quaternary) mix with Al2O3. Other oxide combinations may also deliver the same result. Other embodiments include reversing the growth order in non-polar devices as required, where it may be advantageous to grow the impact ionization layer 1660 on top of the light emitting intrinsic layer 1640.

In addition to the condition of electrons and holes injected by ways described in this disclosure, a requirement for light emission is that the light emitting layer be a direct semiconductor and that the epitaxial stack can be produced with a sufficiently low defect density. Both of these requirements will be affected by the material choice and the layer thicknesses and the deposition techniques and the deposition parameters. The example of FIG. 16 therefore may be extended to a wide variety of other layer combinations and shall not be limited by the illustrated example.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A light-emitting diode device comprising:
a first conductivity type layer having a first conductivity type;
a first intrinsic layer on the first conductivity type layer;
a charge layer on the first intrinsic layer, the charge layer comprising a first material and having a net charge of the first conductivity type;
an impact ionization layer on the charge layer, the impact ionization layer comprising a second material; and
a contact layer on the impact ionization layer;
wherein the first material comprises a polar oxide or a non-polar oxide; and
wherein the charge layer forms a barrier for transporting carriers of the first conductivity type until a bias is applied between the first conductivity type layer and the contact layer to flatten the barrier.

2. The device of claim 1, wherein:
the first material of the charge layer comprises a chirped layer comprising alternating layers of a first sub-material and a second sub-material; and
a thickness of the first sub-material or the second sub-material is variable across the chirped layer.

3. The device of claim 1, wherein the charge layer comprises a chirped layer comprising the polar oxide and a second polar oxide, or comprising the polar oxide and the non-polar oxide.

4. The device of claim 1, wherein the charge layer comprises the polar oxide and the non-polar oxide, grown heterogeneously.

5. The device of claim 1, wherein the polar oxide is BeO or ZnO having a wurtzite structure.

6. The device of claim 1, wherein the polar oxide is a kappa phase of $Al_2O_3$ or $Ga_2O_3$.

7. The device of claim 1, wherein the non-polar oxide is an alpha or beta phase of $Al_2O_3$ or $Ga_2O_3$.

8. The device of claim 1, wherein:
the first material comprises a first sub-material and a second sub-material; and
at least one of the first sub-material or the second sub-material is the polar oxide.

9. The device of claim 1, wherein the first material of the charge layer comprises a strain profile that creates the net charge.

10. The device of claim 1, wherein the bias is applied such that a resulting electric field in the impact ionization layer is greater than or equal to an impact ionization threshold for the second material.

11. A light-emitting diode device comprising:
a first conductivity type layer having a first conductivity type;
an impact ionization layer on the first conductivity type layer, the impact ionization layer comprising a first material;
a charge layer on the impact ionization layer, the charge layer comprising a second material and having a net charge of the first conductivity type;
a first intrinsic layer on the charge layer; and
a contact layer on the first intrinsic layer;

wherein the second material comprises a polar oxide or a non-polar oxide; and wherein the charge layer forms a barrier for transporting carriers of the first conductivity type until a bias is applied between the first conductivity type layer and the contact layer to flatten the barrier.

12. The device of claim 11, wherein:

the second material of the charge layer comprises a chirped layer comprising alternating layers of a first sub-material and a second sub-material; and a thickness of the first sub-material or the second sub-material is variable across the chirped layer.

13. The device of claim 11, wherein the charge layer comprises a chirp layer comprising the polar oxide and a second polar oxide, or comprising the polar oxide and the non-polar oxide.

14. The device of claim 11, wherein the charge layer comprises the polar oxide and the non-polar oxide, grown heterogeneously.

15. The device of claim 11, wherein the polar oxide is BeO or ZnO having a wurtzite structure.

16. The device of claim 11, wherein the polar oxide is a kappa phase of $Al_2O_3$ or $Ga_2O_3$.

17. The device of claim 11, wherein the non-polar oxide is an alpha or beta phase of $Al_2O_3$ or $Ga_2O_3$.

18. The device of claim 11, wherein the impact ionization layer is a second intrinsic layer, and the contact layer is of the first conductivity type.

19. The device of claim 11, wherein the bias is applied such that a resulting electric field in the impact ionization layer is greater than or equal to an impact ionization threshold for the first material.

* * * * *